(12) United States Patent
Lee

(10) Patent No.: US 12,457,746 B2
(45) Date of Patent: *Oct. 28, 2025

(54) SEMICONDUCTOR DEVICE AND METHOD OF MANUFACTURING THE SAME

(71) Applicant: SK hynix Inc., Icheon-si (KR)

(72) Inventor: Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/624,721

(22) Filed: Apr. 2, 2024

(65) Prior Publication Data
US 2024/0251562 A1 Jul. 25, 2024

Related U.S. Application Data

(60) Continuation of application No. 17/578,718, filed on Jan. 19, 2022, now Pat. No. 11,980,033, which is a (Continued)

(30) Foreign Application Priority Data

Jul. 31, 2017 (KR) .......................... 10-2017-0096929

(51) Int. Cl.
*H10B 43/35* (2023.01)
*H01L 21/768* (2006.01)
(Continued)

(52) U.S. Cl.
CPC ....... *H10B 43/35* (2023.02); *H01L 21/76802* (2013.01); *H01L 21/76877* (2013.01);
(Continued)

(58) Field of Classification Search
CPC ........... H01L 27/1157; H01L 21/76802; H01L 27/11524; H01L 21/76877; H01L 23/5226;
(Continued)

(56) References Cited

U.S. PATENT DOCUMENTS 7,859,066 B2 * 12/2010 Kito .................... H10B 43/30
257/411
9,406,693 B1 * 8/2016 Pang .................. H01L 29/66833
(Continued)

FOREIGN PATENT DOCUMENTS

CN 106856198 A 6/2017
KR 1020130059821 A 6/2013
(Continued)

*Primary Examiner* — Jarrett J Stark
(74) *Attorney, Agent, or Firm* — WILLIAM PARK AND ASSOCIATES LTD.

(57) ABSTRACT

A semiconductor device and a method of manufacturing a semiconductor device may be provided. The semiconductor device may include first and second vertical conductive patterns isolated from each other by a first slit. The semiconductor device may include at least one first half conductive pattern extending toward a first region disposed at one side of the first slit from the first vertical conductive pattern. The semiconductor device may include at least one second half conductive pattern extending toward a second region disposed at the other side of the first slit from the second vertical conductive pattern.

17 Claims, 24 Drawing Sheets

Related U.S. Application Data continuation of application No. 16/851,894, filed on Apr. 17, 2020, now Pat. No. 11,264,399, which is a division of application No. 15/914,130, filed on Mar. 7, 2018, now Pat. No. 10,665,601.

(51) Int. Cl.

| | | |
|---|---|---|
| *H01L 23/522* | (2006.01) | |
| *H10B 41/10* | (2023.01) | |
| *H10B 41/27* | (2023.01) | |
| *H10B 41/35* | (2023.01) | |
| *H10B 43/27* | (2023.01) | |
| *H10B 43/10* | (2023.01) | |

(52) U.S. Cl.
CPC ......... *H01L 23/5226* (2013.01); *H10B 41/10* (2023.02); *H10B 41/27* (2023.02); *H10B 41/35* (2023.02); *H10B 43/27* (2023.02); *H10B 43/10* (2023.02)

(58) Field of Classification Search
CPC ......... H01L 27/11519; H01L 27/11565; H01L 27/11551–11556; H01L 27/11578–11582; H01L 29/41725–41791; H01L 29/7839; H01L 29/806; H10B 43/35; H10B 41/10; H10B 41/27; H10B 41/35; H10B 43/27; H10B 43/10; H10B 69/00; H10B 41/41; H10D 30/68

See application file for complete search history.

(56) References Cited

U.S. PATENT DOCUMENTS

| | | | | |
|---|---|---|---|---|
| 9,530,848 | B2* | 12/2016 | Seo | H01L 29/66825 |
| 9,768,192 | B1* | 9/2017 | Nakamura | H10B 43/27 |
| 9,780,034 | B1* | 10/2017 | Tsutsumi | H10B 43/35 |
| 10,943,919 | B2* | 3/2021 | Kobayashi | H10B 41/27 |
| 2012/0098049 | A1 | 4/2012 | Moon et al. | |
| 2015/0155296 | A1* | 6/2015 | Yoon | H01L 29/6656 257/324 |
| 2015/0162263 | A1 | 6/2015 | Han | |
| 2015/0303269 | A1* | 10/2015 | Seo | H01L 29/66833 438/589 |
| 2015/0371993 | A1 | 12/2015 | Jung | |
| 2016/0225697 | A1* | 8/2016 | Lee | H01L 27/0207 |
| 2016/0247816 | A1* | 8/2016 | Kuniya | H10B 43/10 |
| 2016/0322378 | A1* | 11/2016 | Ito | H10B 43/27 |
| 2016/0322381 | A1* | 11/2016 | Liu | H10B 41/27 |
| 2017/0213845 | A1* | 7/2017 | Baba | H10B 43/27 |
| 2017/0330628 | A1* | 11/2017 | Oh | G11C 8/12 |
| 2019/0074287 | A1* | 3/2019 | Yagi | H10B 43/27 |
| 2019/0074290 | A1* | 3/2019 | Xiao | H10B 43/10 |

FOREIGN PATENT DOCUMENTS

| | | |
|---|---|---|
| KR | 1020150047823 A | 5/2015 |
| KR | 1020150050877 A | 5/2015 |

* cited by examiner

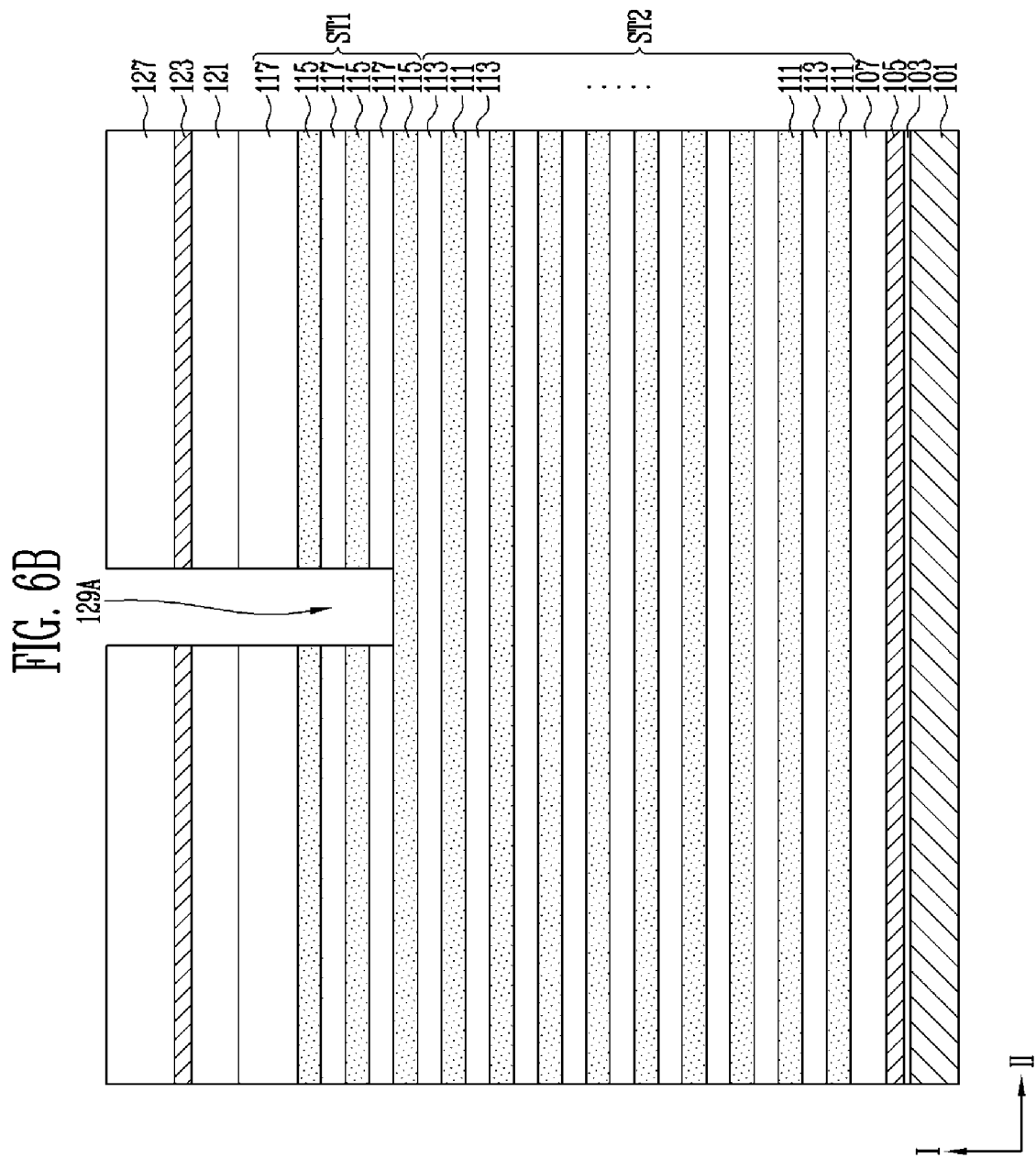

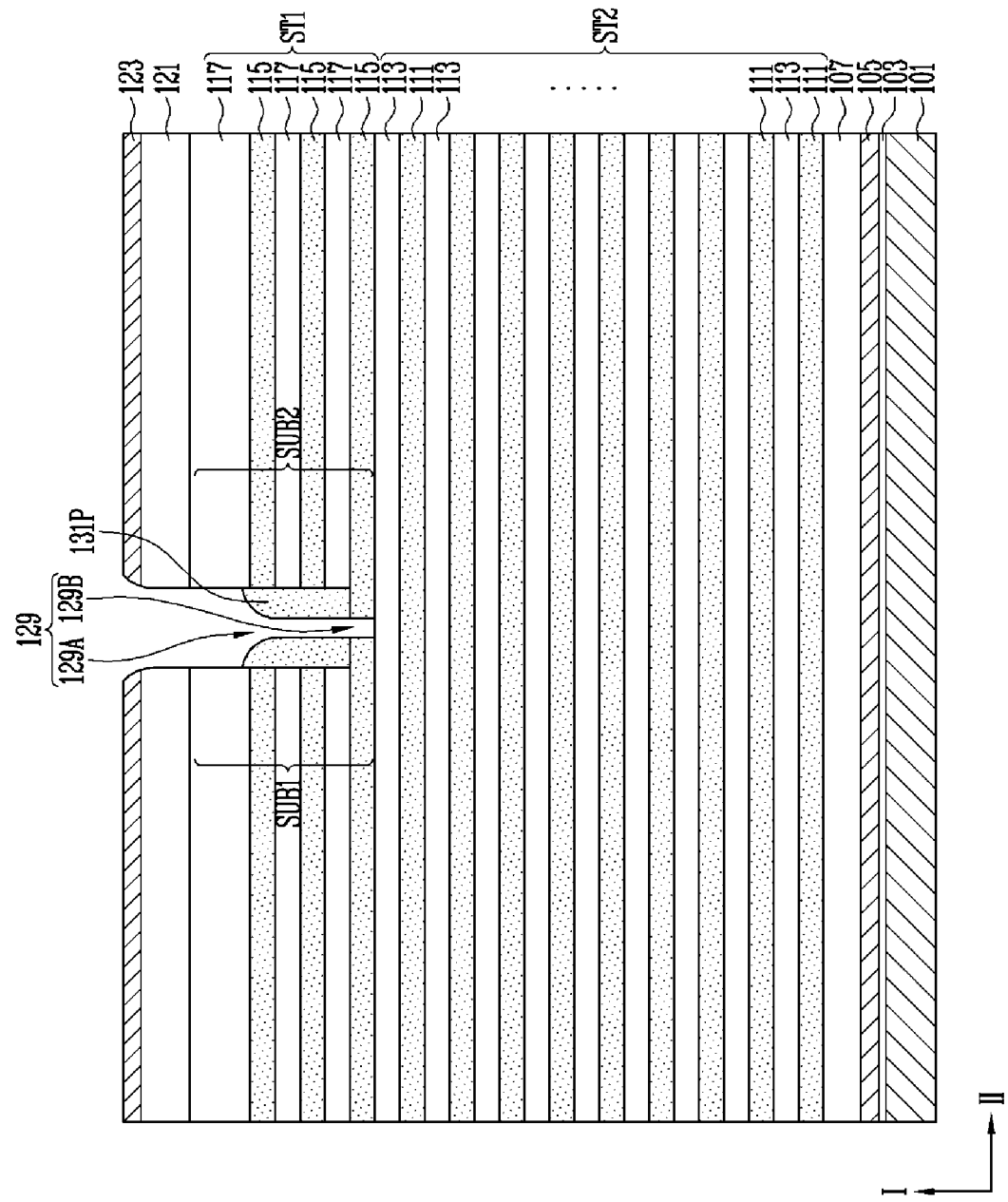

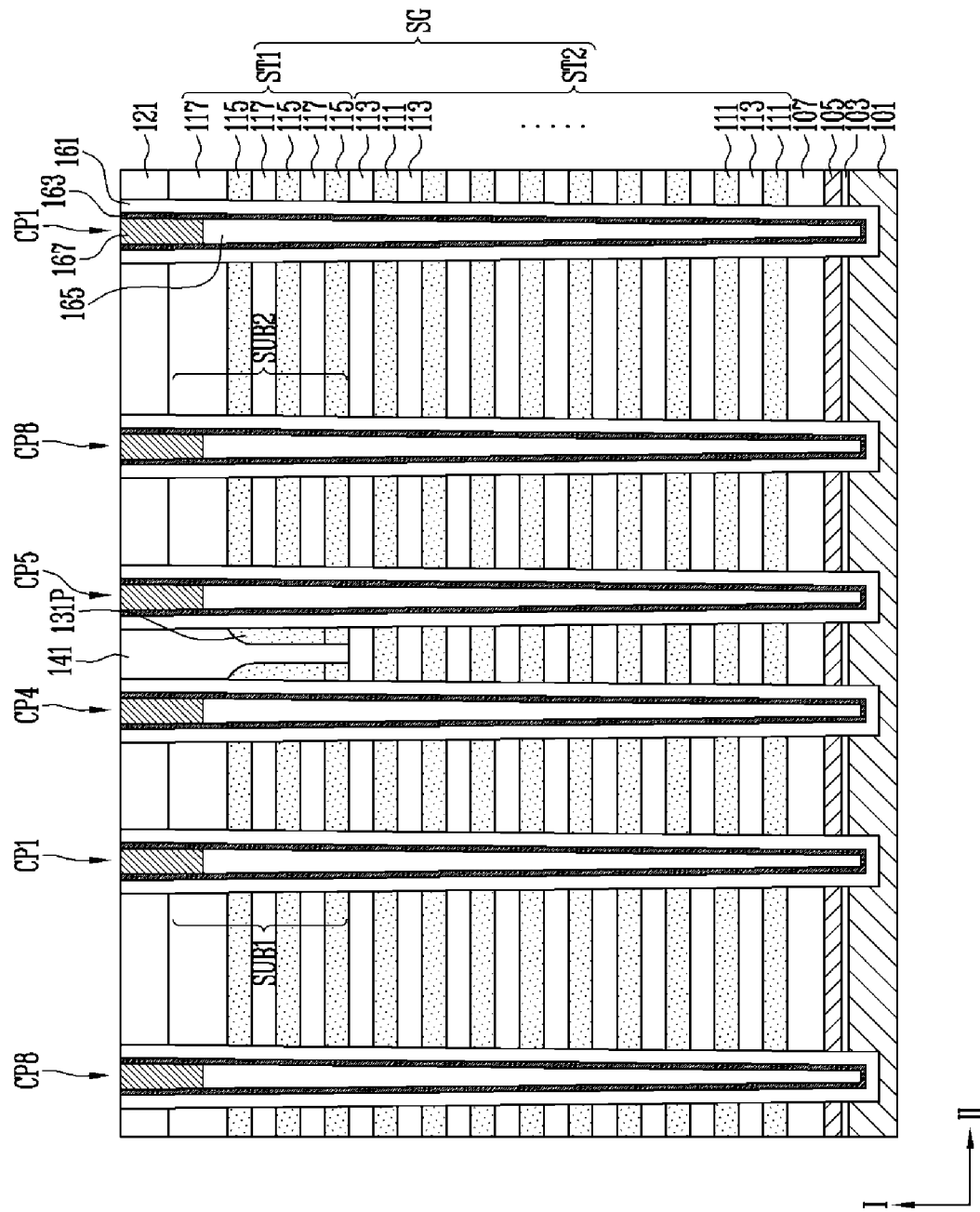

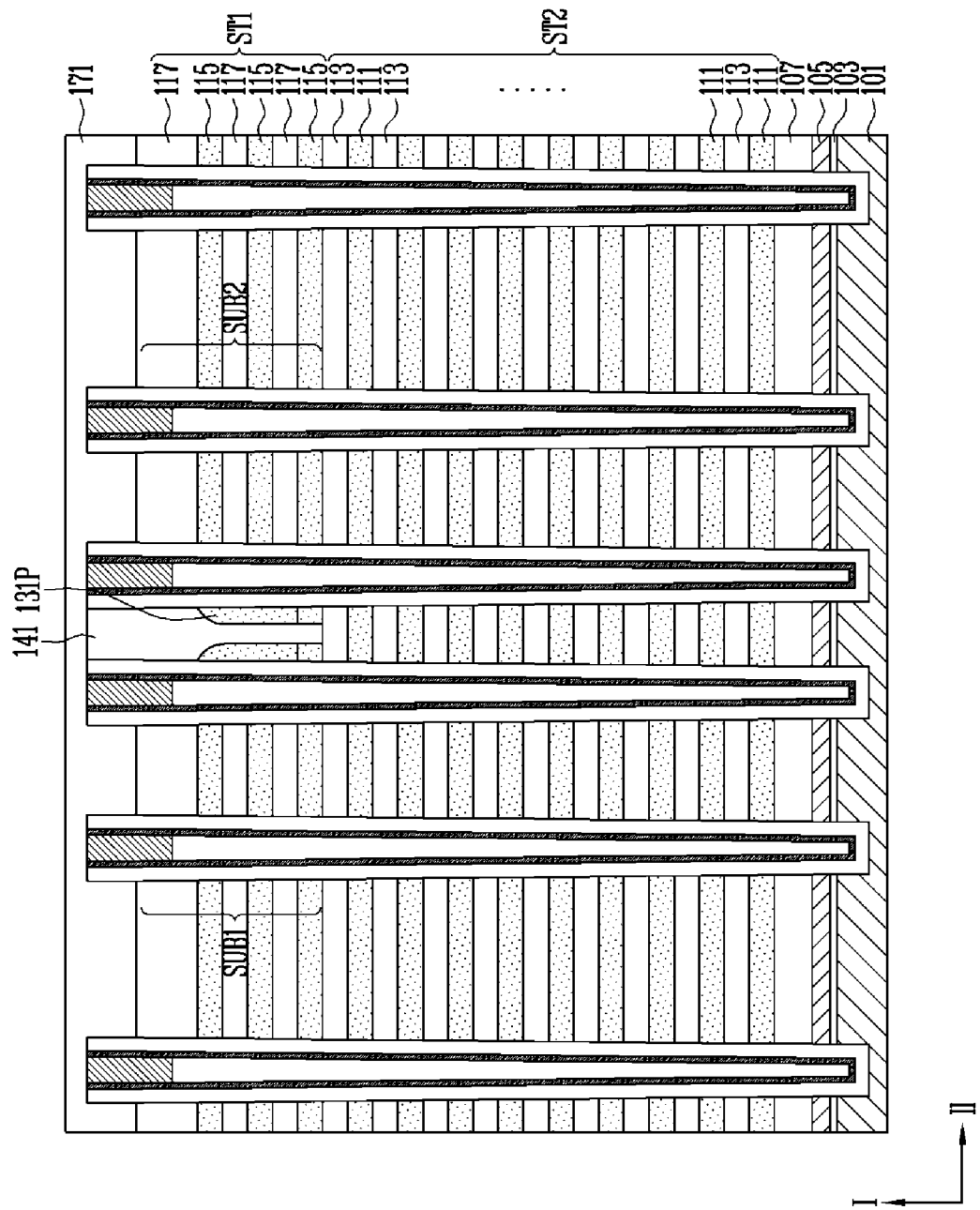

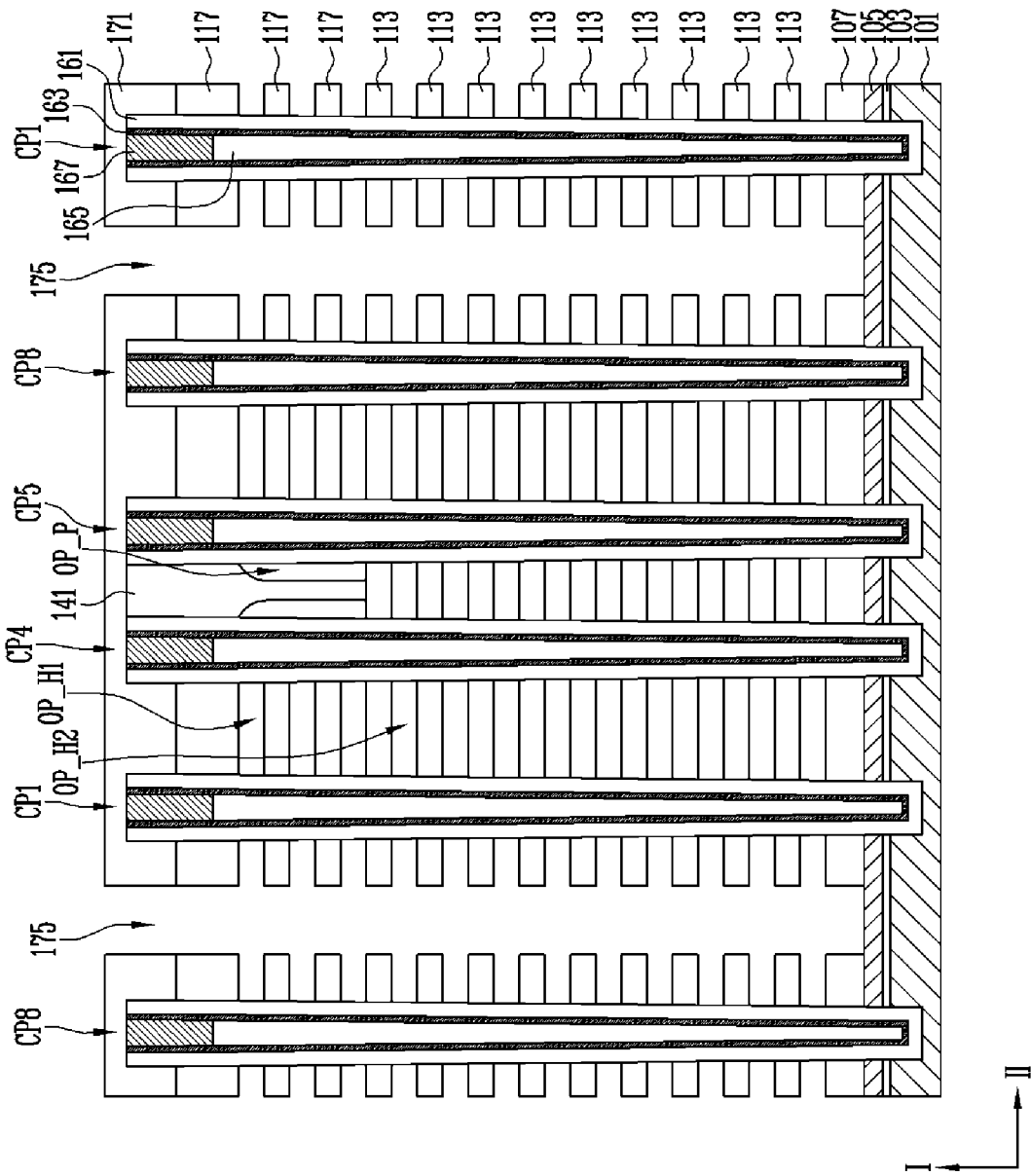

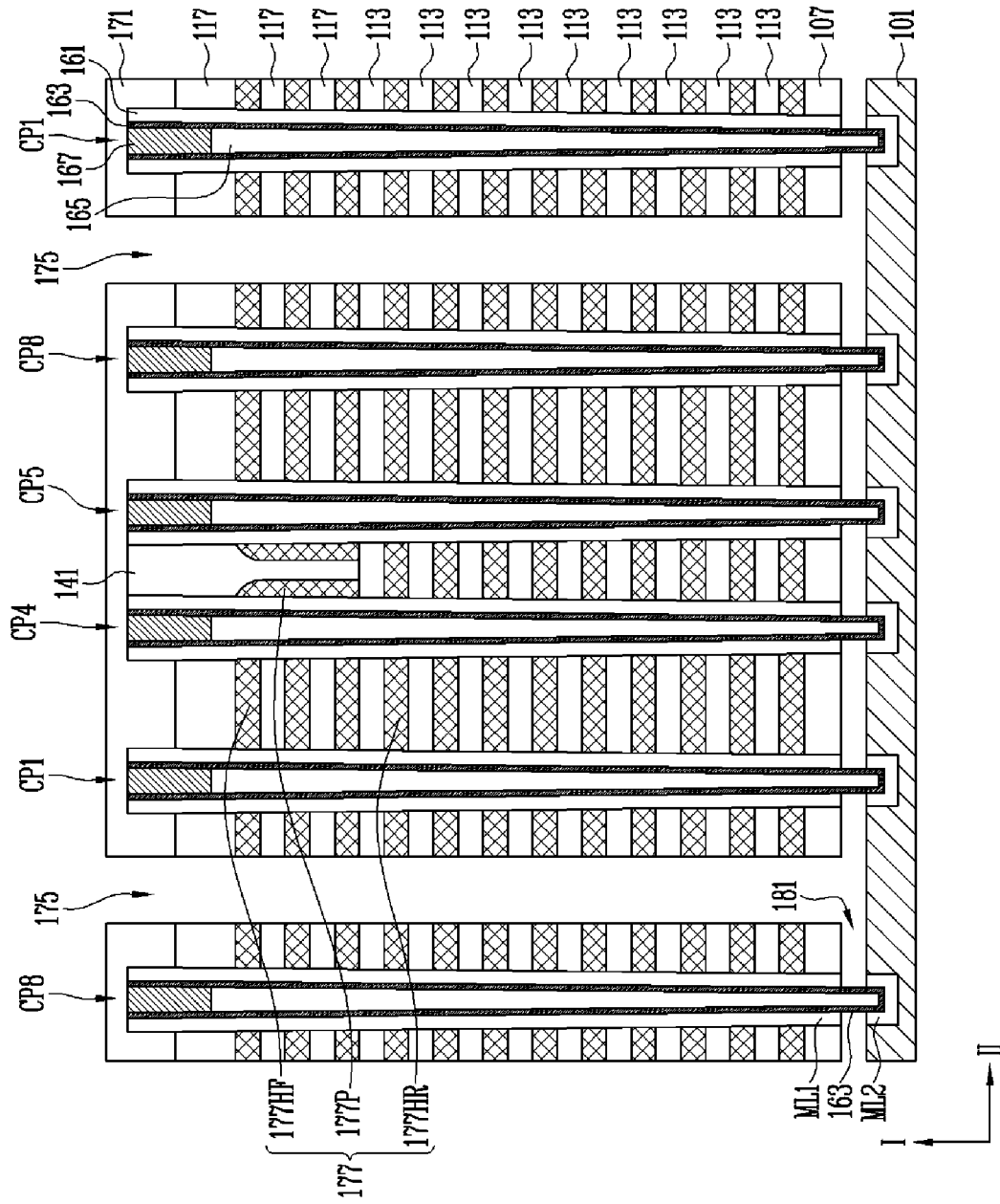

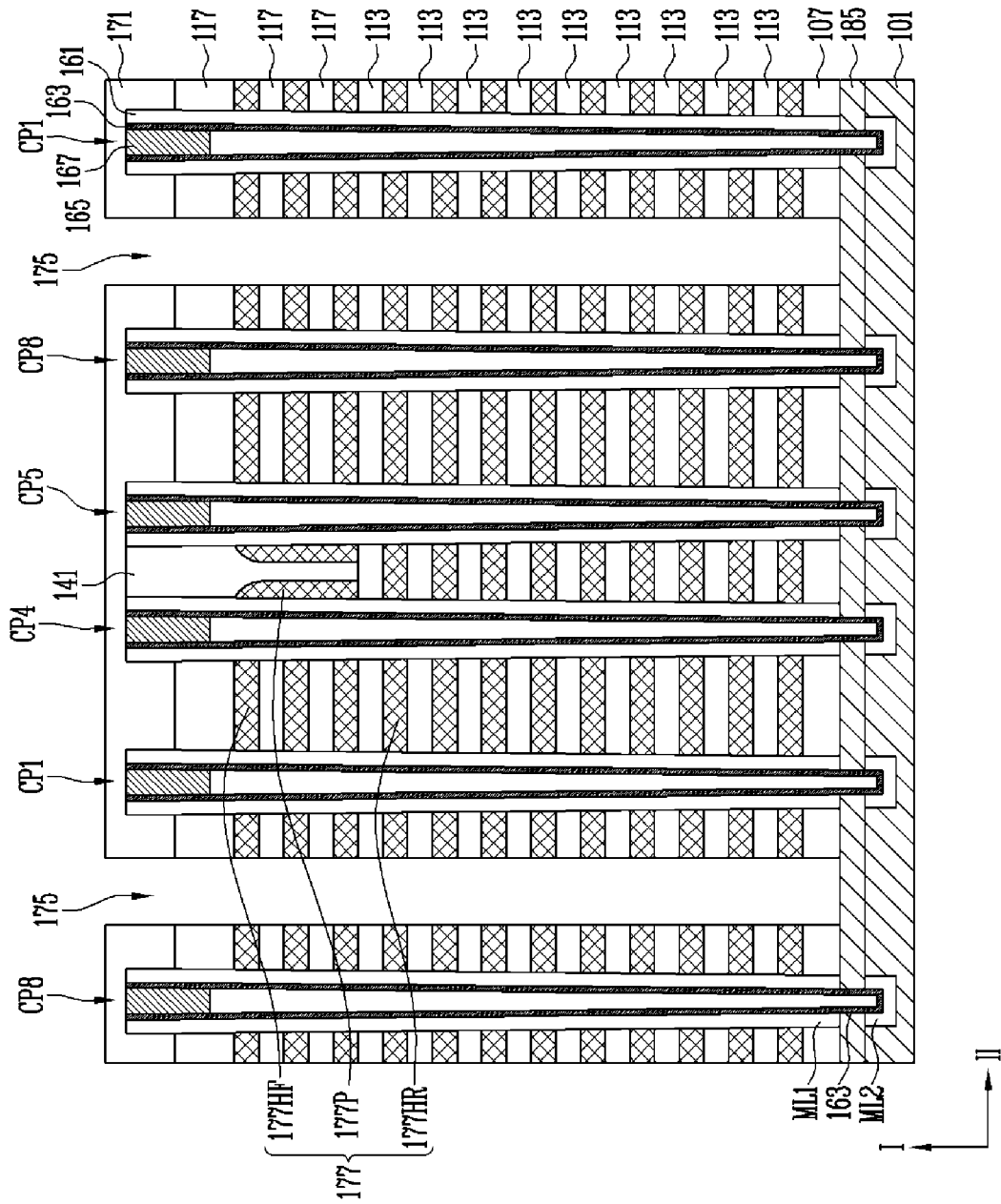

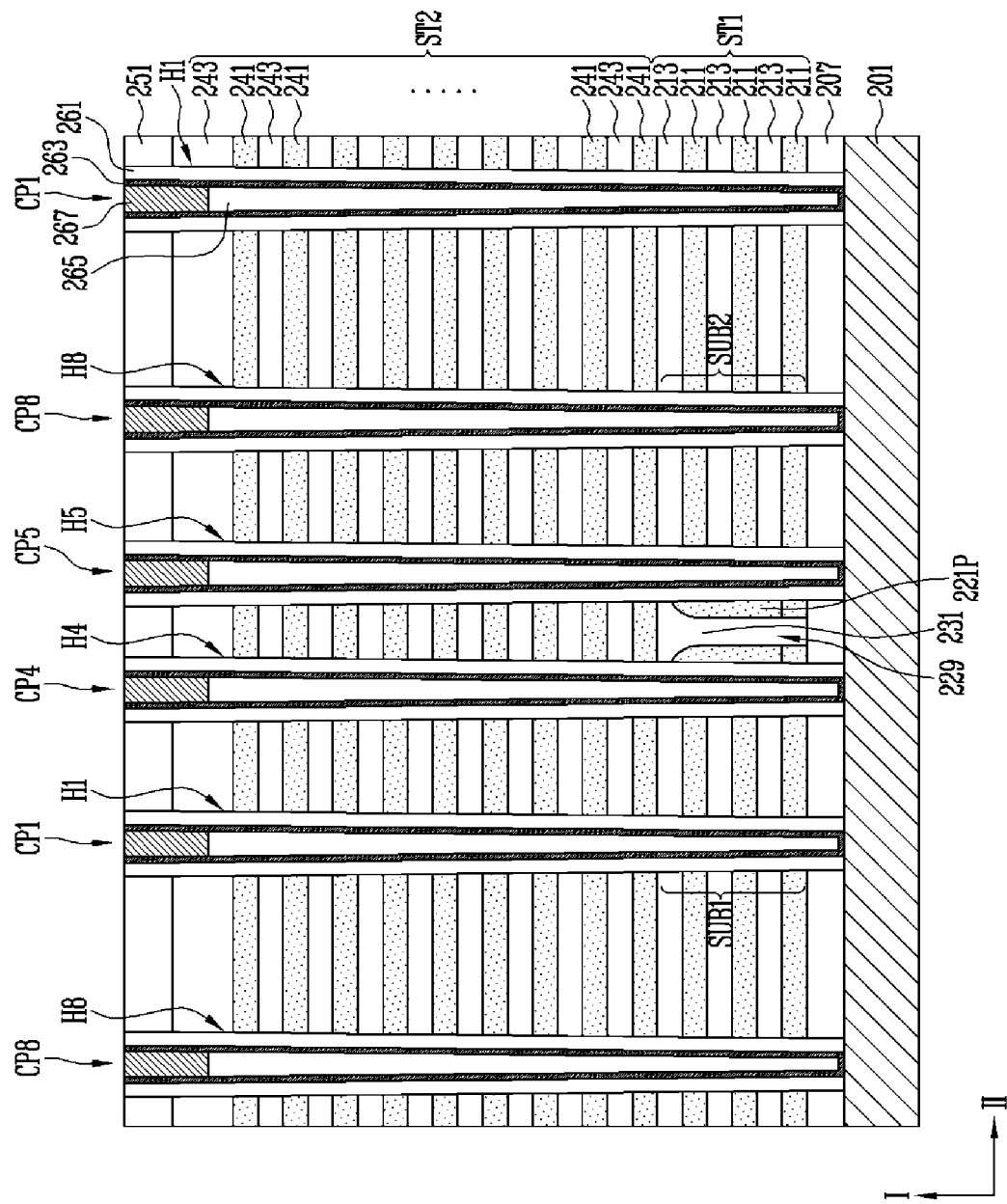

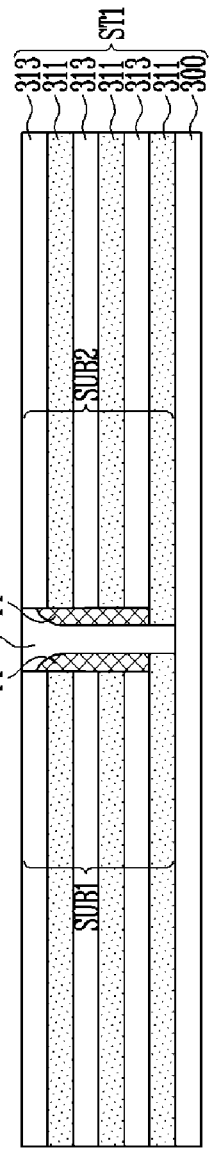
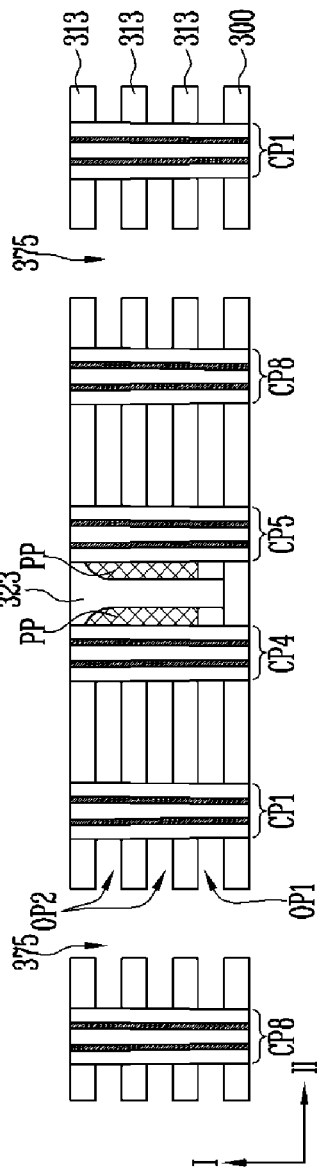
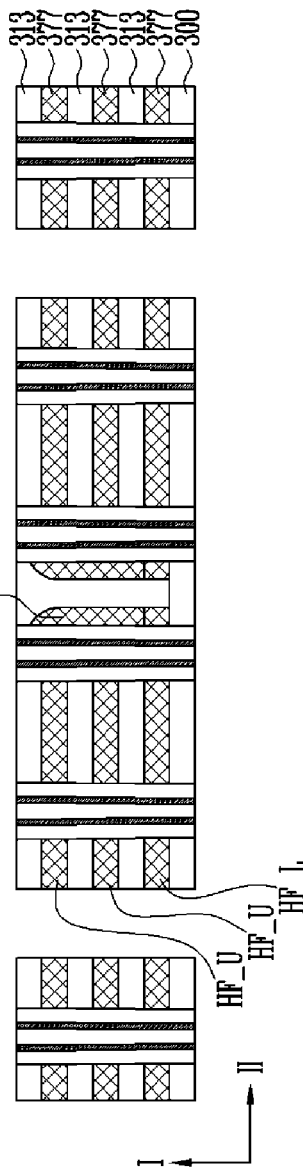
FIG. 8A
FIG. 8B
FIG. 8C

SEMICONDUCTOR DEVICE AND METHOD OF MANUFACTURING THE SAME

CROSS-REFERENCE TO RELATED APPLICATION

The present application is a continuation application of U.S. patent application Ser. No. 17/578,718, filed on Jan. 19, 2022, which is a continuation application of U.S. patent application Ser. No. 16/851,894, filed on Apr. 17, 2020, which is a divisional application of U.S. patent application Ser. No. 15/914,130, filed on Mar. 7, 2018, and claims priority under 35 U.S.C. § 119(a) to Korean patent application number 10-2017-0096929 filed on Jul. 31, 2017 in the Korean Intellectual Property Office, the entire contents of which applications are incorporated herein by reference.

BACKGROUND

1. Technical Field

An aspect of the present disclosure may generally relate to a semiconductor device and a manufacturing method thereof, and more particularly, to a three-dimensional semiconductor device and a manufacturing method thereof.

2. Related Art

A semiconductor device includes memory cell transistors capable of storing data. A three-dimensional semiconductor device may include memory cell transistors arranged in first to third directions different from one another. The three-dimensional semiconductor device includes lines such as select lines and word lines to transmit electrical signals to the memory cell transistors.

SUMMARY

According to an aspect of the present disclosure, there may be provided a semiconductor device. The semiconductor device may include first and second vertical conductive patterns isolated from each other by a first slit. The semiconductor device may include at least one first half conductive pattern extending toward a first region disposed at one side of the first slit from the first vertical conductive pattern. The semiconductor device may include at least one second half conductive pattern extending toward a second region disposed at the other side of the first slit from the second vertical conductive pattern.

According to an aspect of the present disclosure, there may be provided a method of manufacturing a semiconductor device. The method may include forming a first stack structure by alternately stacking at least one pair of first and second material layers. The method may include forming a first slit that isolates the first stack structure into first and second sub-stack structures by penetrating the first material layer and the second material layer and has both sidewalls covered by vertical patterns.

BRIEF DESCRIPTION OF THE DRAWINGS

FIGS. 6A to 6K are sectional views illustrating a manufacturing method of a semiconductor device according to an embodiment of the present disclosure.

FIGS. 7A to 7C are sectional views illustrating a manufacturing method of a semiconductor device according to an embodiment of the present disclosure.

FIGS. 8A to 8C are sectional views illustrating a manufacturing method of a semiconductor device according to an embodiment of the present disclosure.

DETAILED DESCRIPTION

Figure 1A:
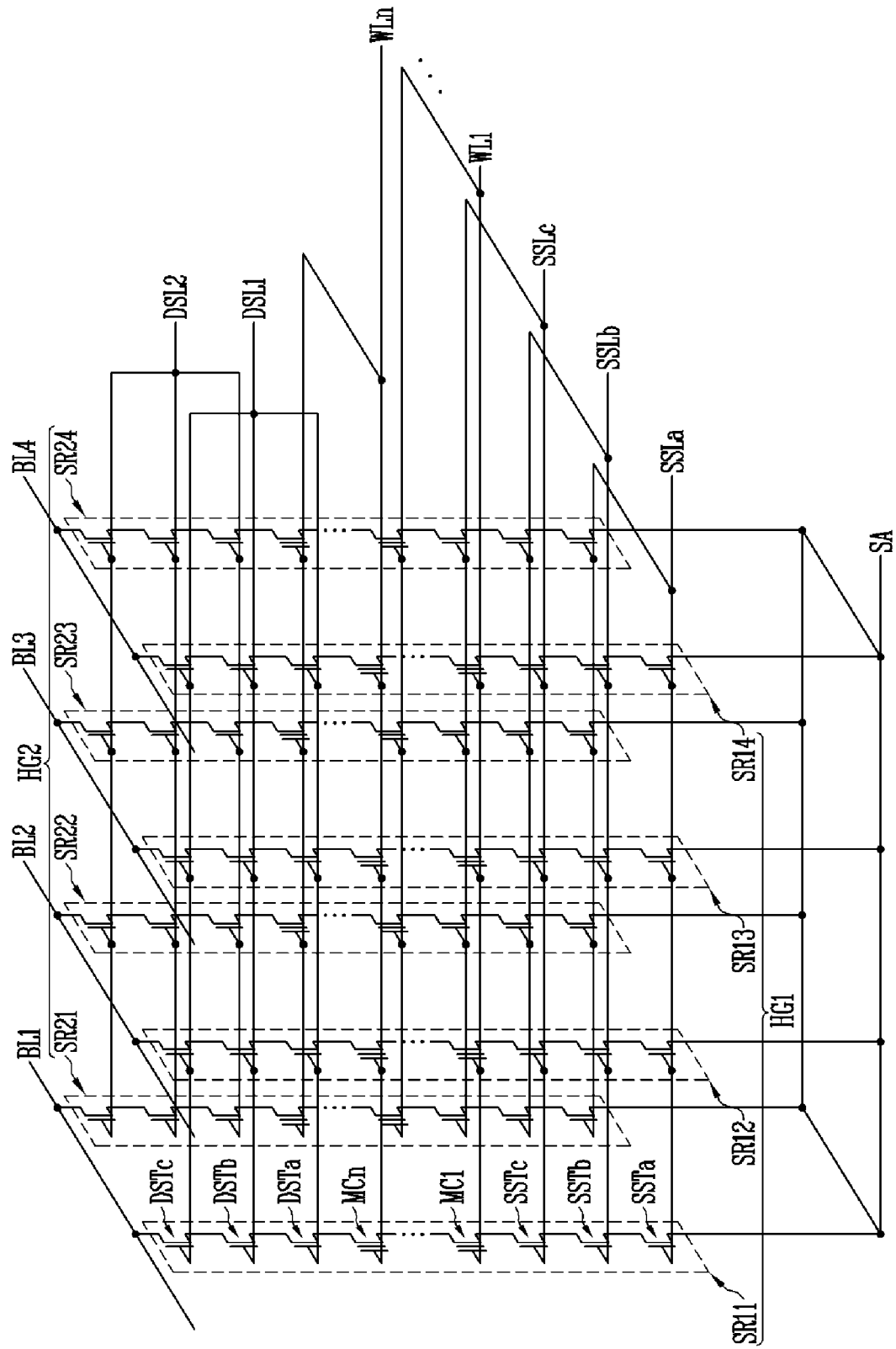
FIGS. 1A and 1B are schematic circuit diagrams of semiconductor devices according to embodiments of the present disclosure.

Examples of embodiments of the present disclosure will be described with reference to the accompanying drawings. The examples of embodiments of the present disclosure may however, be embodied in many different forms and should not be construed as limited to the examples of embodiments set forth herein. Rather, the examples of the embodiments are provided so that disclosure of the present disclosure will be thorough and complete, and will fully convey the scope of the present disclosure to those skilled in the art. The features of examples of the embodiments of the present disclosure may be employed in various and numerous embodiments without departing from the scope of the present disclosure. In the drawings, the size and relative sizes of layers and areas may be exaggerated for clarity. The drawings are not to scale. Like reference numerals refer to like elements throughout.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

It is also noted that, "on" refers to one component not only directly on another component but also indirectly on another component through an intermediate component or intermediate components. On the other hand, 'directly on' refers to one component directly on another component without an intermediate component.

Embodiments provide a semiconductor device and a manufacturing method thereof, which may increase a degree of integration and improve operational reliability.

Figure 1B:
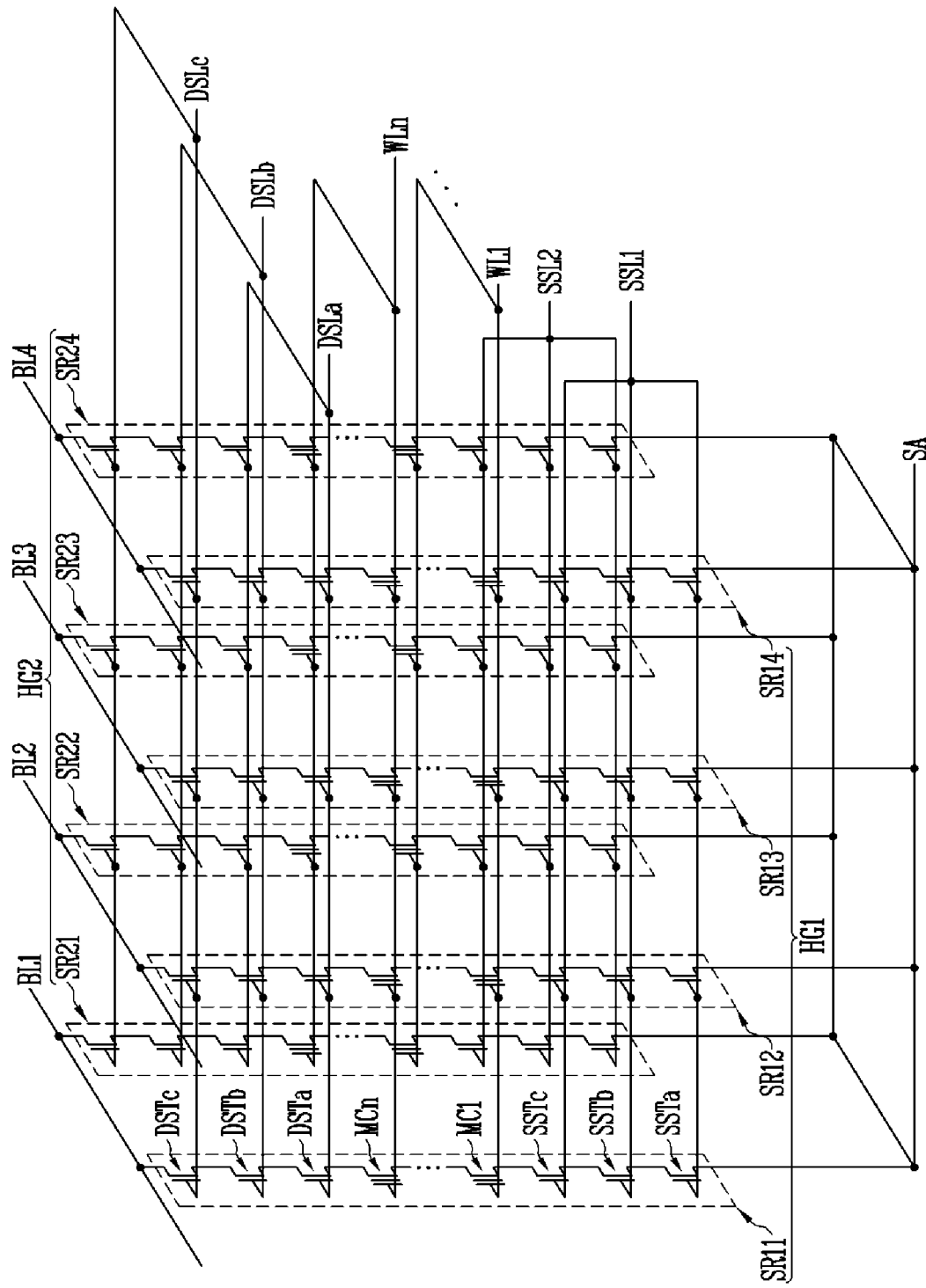

FIGS. 1A and 1B are schematic circuit diagrams of semiconductor devices according to embodiments of the present disclosure.

Referring to FIGS. 1A and 1B, the semiconductor device according to each of the embodiments of the present disclosure includes a plurality of memory strings SR11 to SR14 and SR21 to SR24 connected between bit lines BL1 to BL4 and a source region SA. Although four bit lines BL1 to BL4 parallel to one another are illustrated in FIGS. 1A and 1B, the number of bit lines is not limited thereto. The memory strings are divided into a first half group HG1 and a second half group HG2.

First memory strings SR11 to SR14 included in the first half group HG1 may be connected to the bit lines BL1 to BL4, respectively. Second memory strings SR21 to SR24 included in the second half group HG2 may be connected to the bit lines BL1 to BL4, respectively.

The first memory strings SR11 to SR14 and the second memory strings SR21 to SR24 may be arranged in a zigzag form so as to improve a degree of integration. The arrangement of the first memory strings SR11 to SR14 and the second memory strings SR21 to SR24 is defined by an arrangement of channel pillars. The arrangement of channel pillars will be described later with reference to FIGS. 2A to 3B.

Each of the first memory strings SR11 to SR14 and the second memory strings SR21 to SR24 may include a source select transistor SSTa, SSTb or SSTc, a plurality of memory cell transistors MC1 to MCn (n is a natural number of 2 or more), and a drain select transistor DSTa, DSTb or DSTc, which are connected in series by a channel pillar. Each of the first memory strings SR11 to SR14 and the second memory strings SR21 to SR24 may include one drain select transistor DSTa or two or more drain select transistors DSTa to DSTc, which are connected in series. Each of the first memory strings SR11 to SR14 and the second memory strings SR21 to SR24 may include one source select transistor SSTa or two or more source select transistors SSTa to SSTc, which are connected in series.

Gates of the memory cell transistors MC1 to MCn are connected to word lines WL1 to WLn. The first half group HG1 and the second half group HG2 share each of the word lines WL1 to WLn.

Referring to FIG. 1A, gates of the source select transistors SSTa, SSTb, and SSTc are connected to source select lines SSLa, SSLb, and SSLc, respectively. The source select lines SSLa, SSLb, and SSLc may be individually controlled or be connected to each other to be simultaneously controlled. The first half group HG1 and the second half group HG2 may share each of the source select lines SSLa, SSLb, and SSLc.

Gates of drain select transistors DSTa, DSTb, and DSTc included in the first memory strings SR11 to SR14 are commonly connected to a first drain select line DSL1. Gates of drain select transistors DSTa, DSTb, and DSTc included in the second memory strings SR21 to SR24 are commonly connected to a second drain select line DSL2. The first drain select line DSL1 and the second drain select line DSL2 are individually controlled.

According to the structure described in FIG. 1A, the first half group HG1 and the second half group HG2 share each of the source select line SSLa, SSLb or SSLc, but are controlled by the first drain select line DSL1 and the second drain select line DSL2, which are different from each other. For example, the first drain select line DSL1 may control electrical connection between the first half group HG1 and the bit lines BL1 to BL4, and the second drain select line DSL2 may control electrical connection between the second half group HG2 and the bit lines BL1 to BL4. Accordingly, if one bit line is selected and one of the first and second drain select lines DSL1 and DSL2 is selected, one of the first memory strings SR11 to SR14 and the second memory strings SR21 to SR24 is selected.

Referring to FIG. 1B, the gates of the drain select transistors DSTa, DSTb, and DSTc are connected to drain select lines DSLa, DSLb, and DSLc, respectively. The drain select lines DSLa, DSLb, and DSLc may be individually controlled or be connected to each other to be simultaneously controlled. The first half group HG1 and the second half group HG2 may share each of the drain select lines DSLa, DSLb, and DSLc.

Gates of source select transistors SSTa, SSTb, and SSTc included in the first memory strings SR11 to SR14 are commonly connected to a first source select line SSL1. Gates of source select transistors SSTa, SSTb, and SSTc included in the second memory strings SR21 to SR24 are commonly connected to a second source select line SSL2. The first source select line SSL1 and the second source select line SSL2 are individually controlled.

According to the structure described in FIG. 1B, the first half group HG1 and the second half group HG2 share the drain select line DSLa, DSLb or DSLc, but are controlled by the first source select line SSL1 and the second source select line SSL2, which are different from each other. For example, the first source select line SSL1 may control electrical connection between the first half group HG1 and the source region SA, and the second source select line SSL2 may control electrical connection between the second half group HG2 and the source region SA. Accordingly, if one bit line is selected and one of the first and second source lines SSL1 and SSL2 is selected, one of the first memory strings SR11 to SR14 and the second memory strings SR21 to SR24 is selected.

Figure 2A:
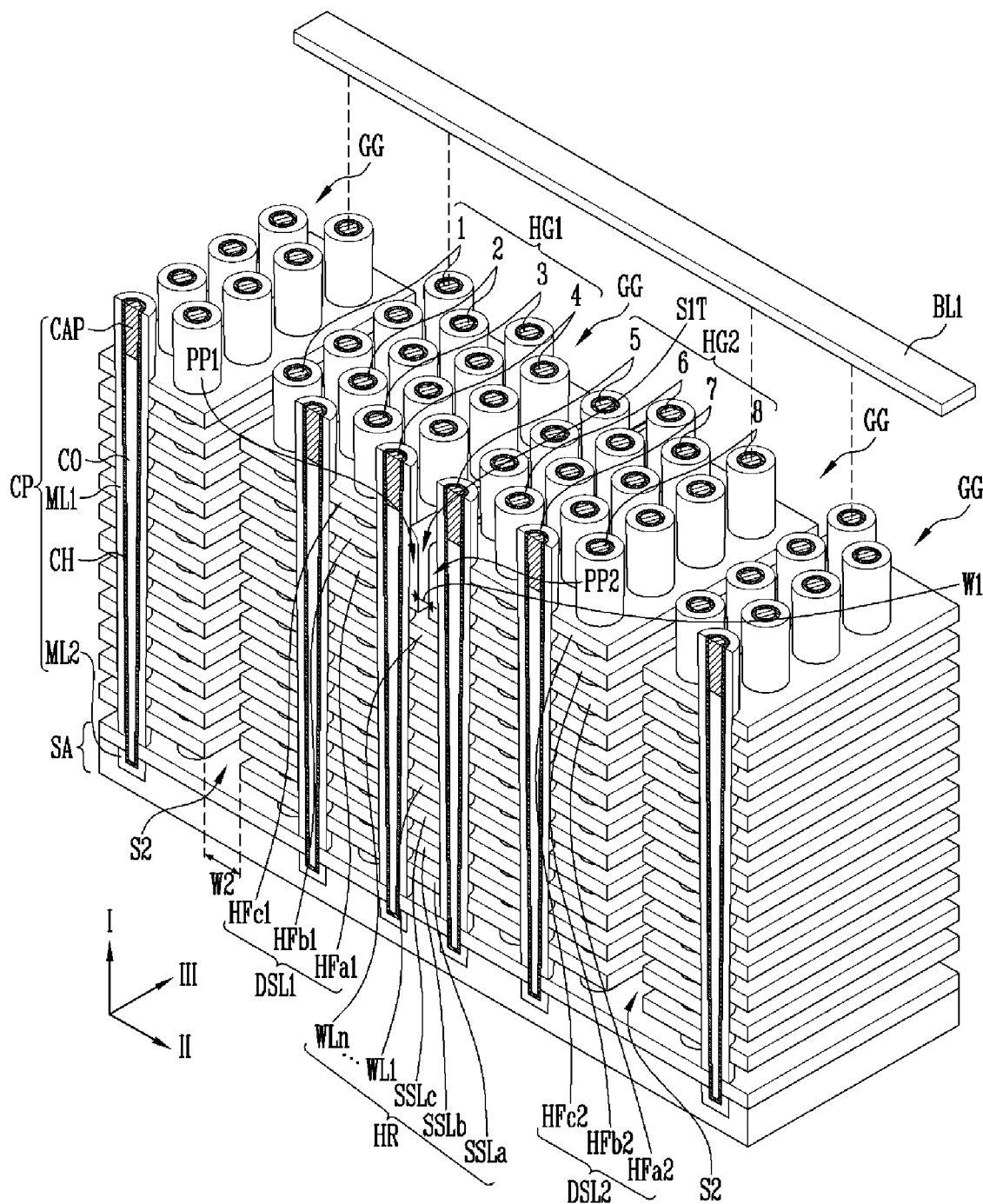
FIGS. 2A to 2B and 3A to 3B are perspective views illustrating semiconductor devices according to embodiments of the present disclosure.
Figure 2B:
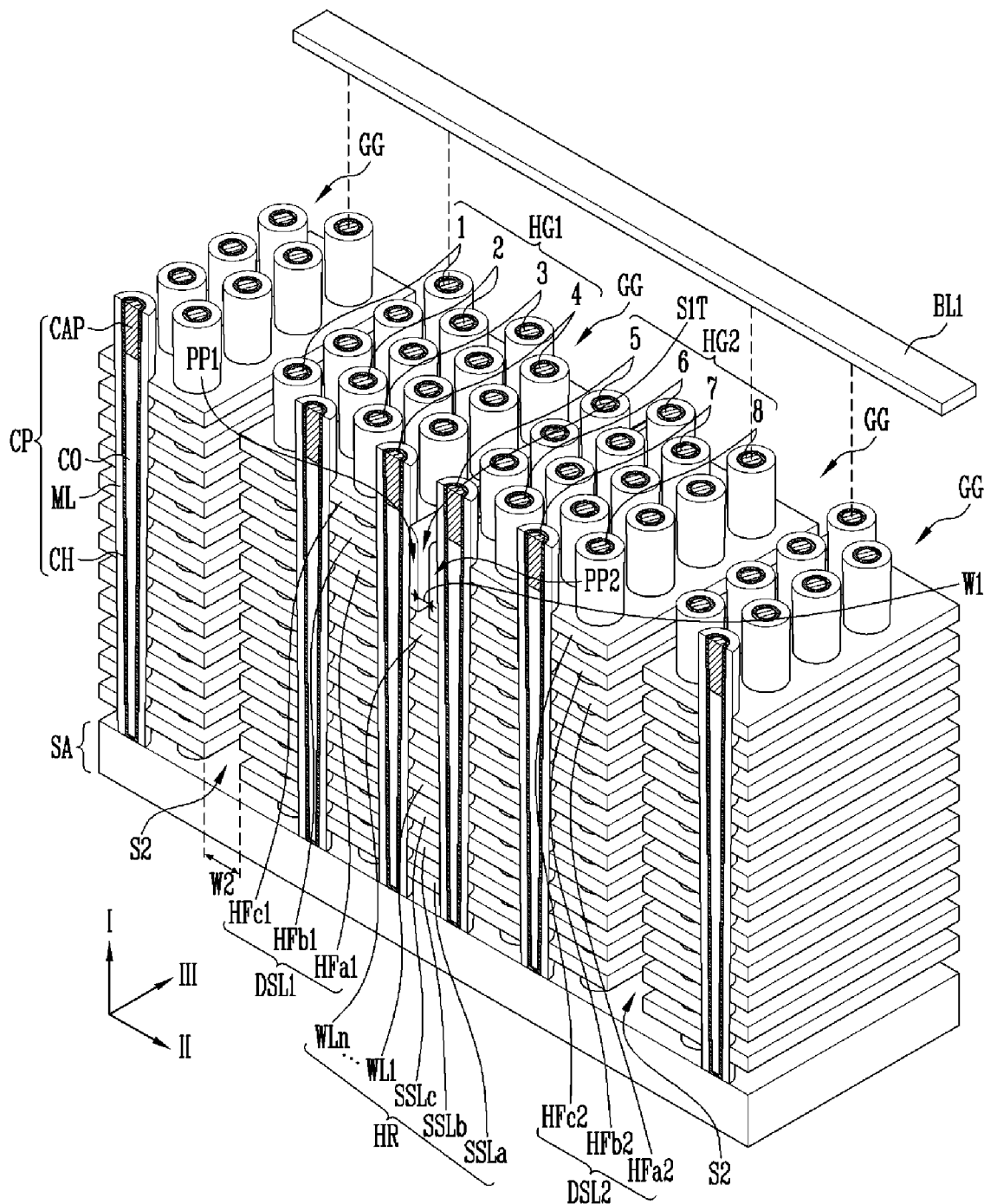
Figure 3A:
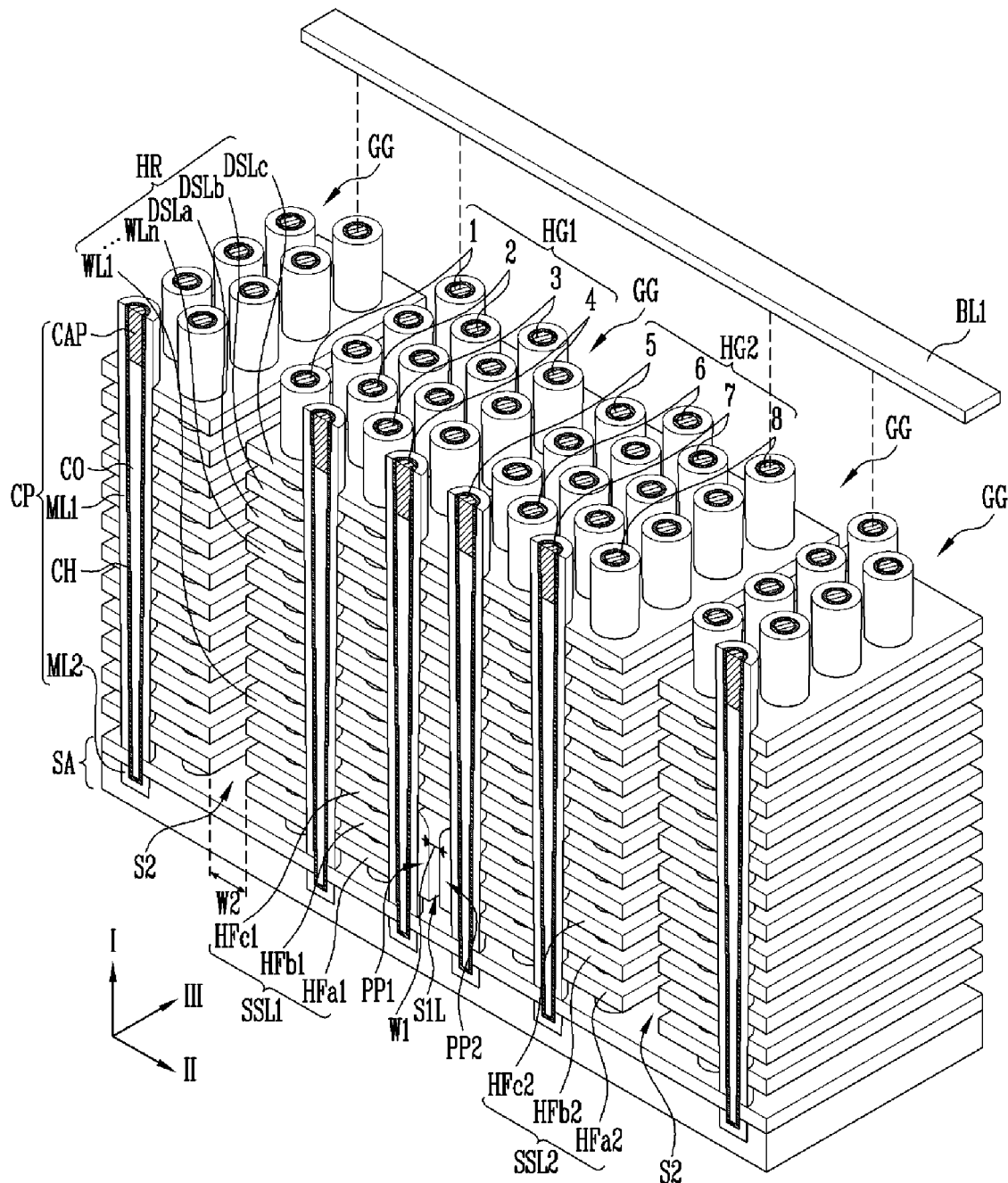
Figure 3B:
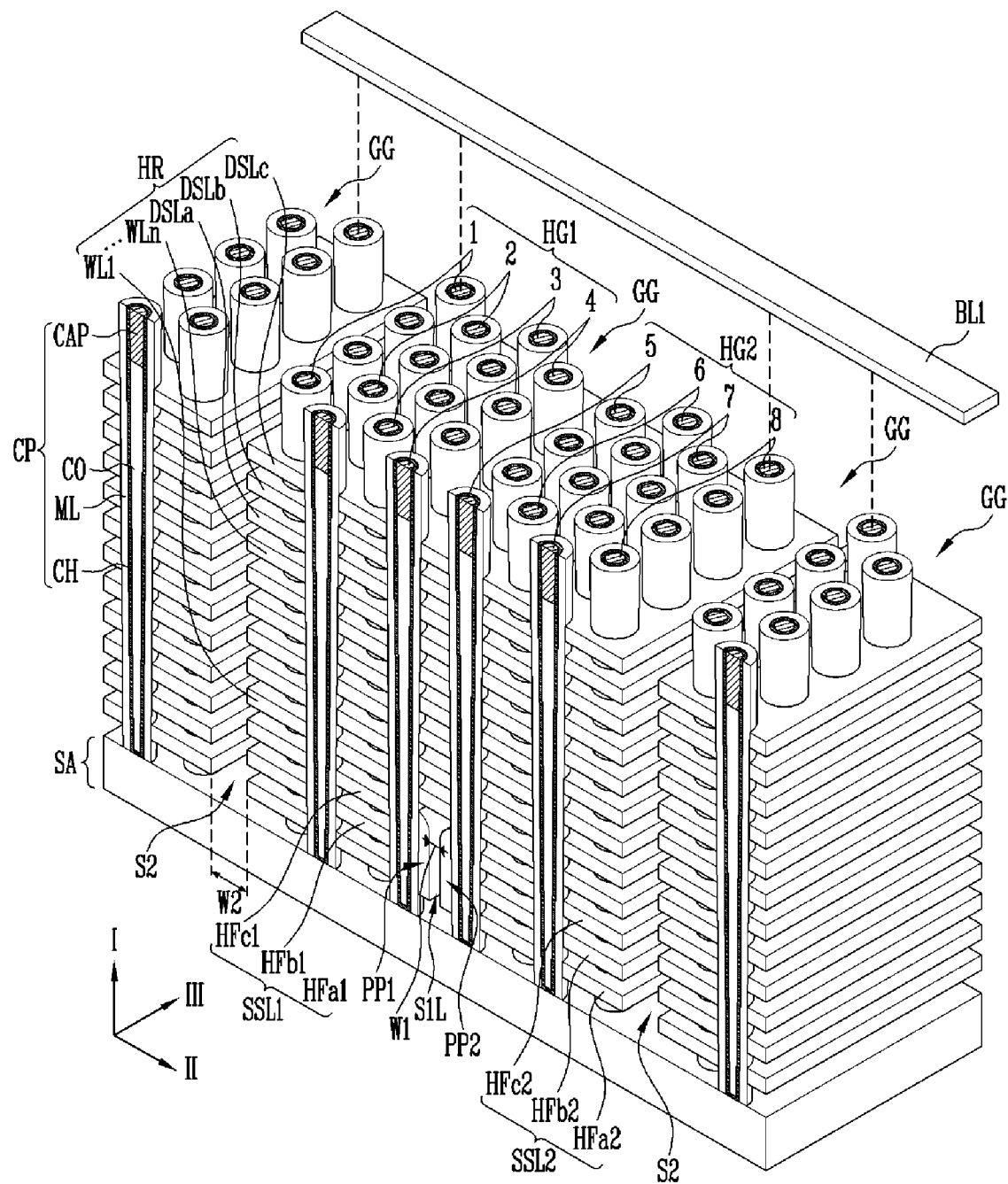

FIGS. 2A to 3B are perspective views illustrating semiconductor devices according to embodiments of the present disclosure. For example, FIGS. 2A and 2B are perspective views illustrating a structure of a semiconductor device constituting the circuit illustrated in FIG. 1A, and FIGS. 3A and 3B are perspective views illustrating a structure of a semiconductor device constituting the circuit illustrated in FIG. 1B.

Referring to FIGS. 2A to 3B, a first half group HG1 and a second half group HG2 may include cell plugs CP and a gate group GG. Each of the cell plugs CP may extend along a first direction I. The cell plugs CP may be arranged in zigzag along a second direction II and a third direction III, which intersect the first direction I. The second direction II and the third direction III may intersect each other. Cell plugs CP arranged in a line along the third direction III constitute a column. Columns configured with the cell plugs CP may be arranged in zigzag in the second direction II.

The first half group HG1 may include cell plugs CP of first to Kth columns, and the second half group HG2 may include cell plugs CP of (K+1)th to 2K columns. In the drawings, a case where K is 4 is illustrated as an example. For example, a case where the first half group HG1 includes cell plugs CP of first to fourth columns 1 to 4 and the second half group HG2 includes cell plugs CP of fifth to eighth columns 5 to 8 is illustrated in the drawings. However, the present disclosure is not limited thereto, and K may be a natural number of 2 or more. The cell plugs CP are connected to a source region SA by penetrating the gate group GG.

Each of the first half group HG1 and the second half group HG2 is disposed between a first slit (S1T illustrated in FIGS. 2A and 2B or S1L illustrated in FIGS. 3A and 3B) and a second slit S2, which are adjacent to each other in the second direction II. The semiconductor device according to each of the embodiments of the present disclosure may include a plurality of gate groups GG isolated by second slits S2. Each of the gate groups GG may be disposed between adjacent second slits S2.

The gate group GG may be disposed between the source region SA and a bit line BL1. For convenience, one bit line BL1 is illustrated in the drawings. The connection relationship between the bit line BL1 and the cell plugs CP may be variously designed. Although the connection relationship between the bit line BL1 and the cell plugs CP is not illustrated in detail in the drawings, the bit line BL1 may be in direct contact with a cell plug CP corresponding thereto, or be electrically connected to a cell plug CP corresponding thereto via a contact plug. The one bit line BL1 may be commonly connected to one of the cell plugs CP of the first half group HG1 and one of the cell plugs CP of the second half group HG2. The bit line BL1 is a conductive material such that an electrical signal can be transmitted therethrough.

The gate group GG includes horizontal conductive patterns HR, at least one of first half conductive patterns HFa1 to HFc1, at least one of second half conductive patterns HFa2 to HFc2, a first vertical conductive pattern PP1, and a second vertical conductive pattern PP2. The first vertical conductive pattern PP1 and the second vertical conductive pattern PP2 are isolated from each other by a first slit S1T or S1L disposed between adjacent second slits S2. Hereinafter, a region that is adjacent to one side of the first slit S1T or S1L and has the first half group HG1 disposed therein is defined as a first region of the semiconductor device, and a region that is adjacent to the other side of the first slit S1T or S1L and has the second half group HG2 disposed therein is defined as a second region of the semiconductor device.

The first vertical conductive pattern PP1 and the second vertical conductive pattern PP2 extend in the second direction II to face a plurality of cell plugs CP. The first vertical conductive pattern PP1 and the second vertical conductive pattern PP2 may be formed of a first conductive material. The first conductive material may include at least one of a doped silicon layer, a metal silicide layer, and a metal layer. In order to achieve low-resistance wiring, tungsten and the like may be used as the first conductive material. The first vertical conductive pattern PP1 and the second vertical conductive pattern PP2 may be formed in a structure in which they are symmetrical to each other with respect to the first slit S1T or S1L.

Each of the first half conductive patterns HFa1 to HFc1 extends toward the first region from the first vertical conductive pattern PP1. The first vertical conductive pattern PP1 may further protrude in the first direction I than the first half conductive patterns HFa1 to HFc1. The first half conductive patterns HFa1 to HFc1 may be stacked in the first direction I to be spaced apart from each other.

Each of the second half conductive patterns HFa2 to HFc2 extends toward the second region from the second vertical conductive pattern PP2. The second vertical conductive pattern PP2 may further protrude in the first direction I than the second half conductive patterns HFa2 to HFc2. The second half conductive patterns HFa2 to HFc2 may be stacked in the first direction I to be spaced apart from each other. The second half conductive patterns HFa2 to HFc2 may be disposed in the same layer as the first half conductive patterns HFa1 to HFc1.

Each of the horizontal conductive patterns HR is disposed between adjacent second slits S2, and extends toward the second region from the first region. Each of the horizontal conductive patterns HR overlap with the first half conductive patterns HFa1 to HFc1 and the second half conductive patterns HFa2 to HFc2. The first slit S1T or S1L is formed not to penetrate the horizontal conductive patterns HR. The horizontal conductive patterns HR may be stacked in the first direction I to be spaced apart from each other.

The cell plugs CP of the first half group HG1 extend toward the source region SA by penetrating the first half conductive patterns HFa1 to HFc1. The cell plugs CP of the second half group HG2 extend toward the source region SA by penetrating the second half conductive patterns HFa2 to HFc2. The cell plugs CP of the first half group HG1 and the second half group HG2 share each of the horizontal conductive patterns HR. Each of the horizontal conductive patterns HR is penetrated by the cell plugs CP of the first and second half groups HG1 and HG2.

Referring to FIGS. 2A and 2B, the first half conductive patterns HFa1 to HFc1 and the first vertical conductive pattern PP1 may form a first drain select line DSL1 adjacent to the bit line BL1. The second half conductive patterns HFa2 to HFc2 and the second vertical conductive pattern PP2 may form a second drain select line DSL2 adjacent to the bit line BL1. The first drain select line DSL1 and the second drain select line DSL2 may be formed in a structure in which they are symmetrical to each other with respect to the first slit S1T.

The horizontal conductive patterns HR may include word lines WL1 to WLn and at least one layer of source select lines SSLa, SSLb, and SSLc. The word lines WL1 to WLn are stacked between the first and second half conductive patterns HFa1 to HFc1 and HFa2 to HFc2 and the source region SA to be spaced apart from each other. The source select lines SSLa, SSLb, and SSLc are disposed between the word lines WL1 to WLn and the source region SA. The source select lines SSLa, SSLb, and SSLc are stacked to be spaced apart from each other.

Referring to FIGS. 3A and 3B, the first half conductive patterns HFa1 to HFc1 and the first conductive pattern PP1 may form a first source select line SSL1 adjacent to the source region SA. The second half conductive patterns HFa2 to HFc2 and the second vertical conductive pattern PP2 may form a second source select line SSL2 adjacent to the source region SA. The first source select line SSL1 and the second source select line SSL2 may be formed in a structure in which they are symmetrical to each other with respect to the first slit S1L.

The horizontal conductive patterns HR may include word lines WL1 to WLn and at least one layer of drain select lines DSLa, DSLb, and DSLc. The word lines WL1 to WLn are stacked between the first and second half conductive patterns HFa1 to HFc1 and HFa2 to HFc2 and the bit line BL1 to be spaced apart from each other. The drain select lines DSLa, DSLb, and DSLc are disposed between the word lines WL1 to WLn and the bit line BL1. The drain select lines DSLa, DSLb, and DSLc are stacked to be spaced apart from each other.

Referring to FIGS. 2A to 3B, the first and second half conductive patterns HFa1 to HFc1 and HFa2 to HFc2 and the horizontal conductive patterns HR may be formed of a second conductive material. The second conductive material may be a material identical to or different from the first conductive material. The second conductive material may include at least one of doped silicon, silicide, and metal. In order to achieve low-resistance wiring, the second conductive material may include metal having a low resistance such as tungsten.

Each of the cell plugs CP may include a channel pillar CH. The channel pillars CH of the cell plugs CP may be divided into first channel pillars and second channel pillars. The first channel pillars belong to the first half group HG1, and penetrate the first half conductive patterns HFa1 to HFc1 in the first region. The second channel pillars belong to the second half group HG2, and penetrate the second half conductive patterns HFa2 to HFc2 in the second region.

The channel pillar CH may be formed of a semiconductor layer. For example, the channel pillar CH may be formed of a silicon layer. The channel pillar CH is disposed in a hole penetrating the gate group GG.

The channel pillar CH may be a thin film that surrounds a core insulating layer CO penetrating the gate group GG. The core insulating layer CO may fill in a central region of the hole penetrating the gate group GG, and the channel pillar CH may be formed along a surface shape of the hole. The core insulating layer CO may be formed with a height lower than that of the channel pillar CH. In this case, each of the cell plugs CP may further include a capping conductive pattern CAP. The capping conductive pattern CAP may be formed on the core insulating layer CO to fill in an upper end center portion defined by an upper surface of the core insulating layer CO and an upper end of the channel pillar CH. The capping conductive pattern CAP may be in direct contact with the channel pillar CH. The capping conductive pattern CAP may be formed of a semiconductor layer doped with a first conductivity type impurity. The first conductivity type impurity may be an n-type impurity. For example, the capping conductive pattern CAP may be a doped silicon layer doped with an n-type impurity. The capping conductive pattern CAP may be used as a drain junction.

Meanwhile, although not illustrated in the drawings, the capping conductive pattern CAP and the core insulating layer CO may be omitted. In this case, the channel pillar CH may be formed to completely fill in the central region of the hole.

Referring to FIGS. 2A and 3A, the channel pillar CH may extend to the inside of the source region SA. A portion of the source region SA may protrude toward a sidewall of the channel pillar CH to be in contact with the sidewall of the channel pillar CH.

Each of the cell pugs CP may further include a first multi-layered memory pattern ML1 and a second multi-layered memory pattern ML2. The first multi-layered memory pattern ML1 may extend along an interface between the channel pillar CH and the gate group GG. The second multi-layered memory pattern ML2 may extend along an interface between the channel pillar CH and the source region SA. The first multi-layered memory pattern ML1 and the second multi-layered memory pattern ML2 may be isolated from each other by a contact part of the source region SA, which protrudes toward the sidewall of the channel pillar CH to be in contact with the sidewall of the channel pillar CH. The second multi-layered memory pattern ML2 between the source region SA and the channel pillar CH may be used as a gate insulating layer.

Referring to FIGS. 2B and 3B, the channel pillar CH may include a bottom surface that is in contact with the source region SA. Each of the cell plugs CP may include a multi-layered memory pattern ML that surrounds the sidewall of the channel pillar CH. The multi-layered memory pattern ML may extend along the interface between the channel pillar CH and the gate group GG. The bottom surface of the channel pillar CH may be in direct contact with the source region SA by penetrating the multi-layered memory pattern ML.

Although not illustrated in FIGS. 2A to 3B, a barrier layer may be further formed between the multi-layered memory pattern ML1 or ML and each of the horizontal conductive patterns HR, the first half conductive patterns HFa1 to HFc1, and the second half conductive patterns HFa2 to HFc2. The barrier layer may function as a protection layer to prevent a direct contact between the multi-layered memory pattern ML1 or ML and each of the horizontal conductive patterns HR, the first half conductive patterns HFa1 to HFc1, and the second half conductive patterns HFa2 to HFc2. The barrier layer may include a titanium nitride layer, a tungsten nitride layer, a tantalum nitride layer, and the like.

Referring to FIGS. 2A to 3B, a portion of the multi-layered memory pattern ML1 or ML disposed between the drain select line DSL1, DSL2, DSLa, DSLb or DSLc and the source select line SSLa, SSLb, SSLc, SSL1 or SSL2 may be used as a gate insulating layer.

Each of the multi-layered memory patterns ML1, ML2, and ML may include a tunnel insulating layer surrounding the channel pillar CH, a data storage layer surrounding the tunnel insulating layer, and a blocking insulating layer surrounding the data storage layer. The data storage layer may store data changed using Fowler-Nordheim tunneling caused by a difference in voltage between the word lines WL1 to WLn and the channel pillar CH. To this end, the data storage layer may be formed of various materials. For example, the data storage layer may be formed of a nitride layer in which charges can be trapped. In addition, the data storage layer may include silicon, a phase change material, nanodots, and the like. The blocking insulating layer may include an oxide layer capable of blocking charges. The tunnel insulating layer may be formed of a silicon oxide layer in which charge tunneling is available.

The source region SA may extend along the second direction II and the third direction III. The source region SA may be formed of at least one doped silicon layer including a first conductivity type impurity. The first conductivity type impurity may be an n-type impurity. The second slits S2 may extend down to the source region SA. Although not illustrated in the drawings, the source region SA may receive an electrical signal applied from a source contact line (not illustrated) disposed in the second slits S2.

The first slit S1T or S1L isolates between the first half conductive patterns HFa1 to HFc1 and the second half conductive patterns HFa2 to HFc2. In this case, the first slit S1T or S1L is formed shorter than the second slit S2 in the first direction I, not to isolate the horizontal conductive patterns HR.

In an embodiment of the present disclosure, the first slit S1T or S1L is formed with a width that enables a horizontal space occupied by the first slit S1T or S1L to be minimized. Accordingly, a first width W1 of the first slit S1T or S1L opened between the first vertical conductive pattern PP1 and the second vertical conductive pattern PP2 may be narrower than a second width W2 of the second slit S2 opened between the gate groups GG. In the embodiment of the present disclosure, the horizontal space occupied by the first slit S1T or S1L is minimized, so that the degree of integration of the semiconductor device can be improved.

In an embodiment of the present disclosure, a dummy plug having the same structure as the cell plugs CP is not disposed between the Kth column 4 and the (K+1)th column 5, which are adjacent to the first slit S1T or S1L. In the embodiment of the present disclosure, the disposition of the dummy plug is omitted, so that the degree of integration of the semiconductor device can be improved. As the dummy plug is omitted, so that the Kth column 4 and the (K+1)th column 5 can become close to each other. In this case, the Kth column 4 and the (K+1)th column 5 may invade a disposition region of the first slit S1T or S1L. If an overlay margin between the Kth column 4 and the (K+1)th column 5 is not sufficiently secured as described above, one side of the Kth column 4 and one side of the (K+1)th column 5, which face the first slit S1T or S1L, may not be covered with the first half conductive patterns HFa1 to HFc1 and the second half conductive patterns HFa2 to HFc2. In an embodiment of the present disclosure, sidewalls of the Kth column 4 and the (K+1)th column 5 may be covered with the first vertical conductive pattern PP1 and the second vertical conductive pattern PP2, which are formed on both sidewalls of the first slit S1T or S1L. Thus, in the embodiment of the present disclosure, the dummy plug is omitted, so that electrical characteristics of select transistors arranged along the Kth column 4 and the (K+1)th column 5 can be ensured through the first vertical conductive pattern PP1 and the second vertical conductive pattern PP2 even when the overlay margin between the Kth column 4 and the (K+1)th column 5 is insufficient.

Figure 4:
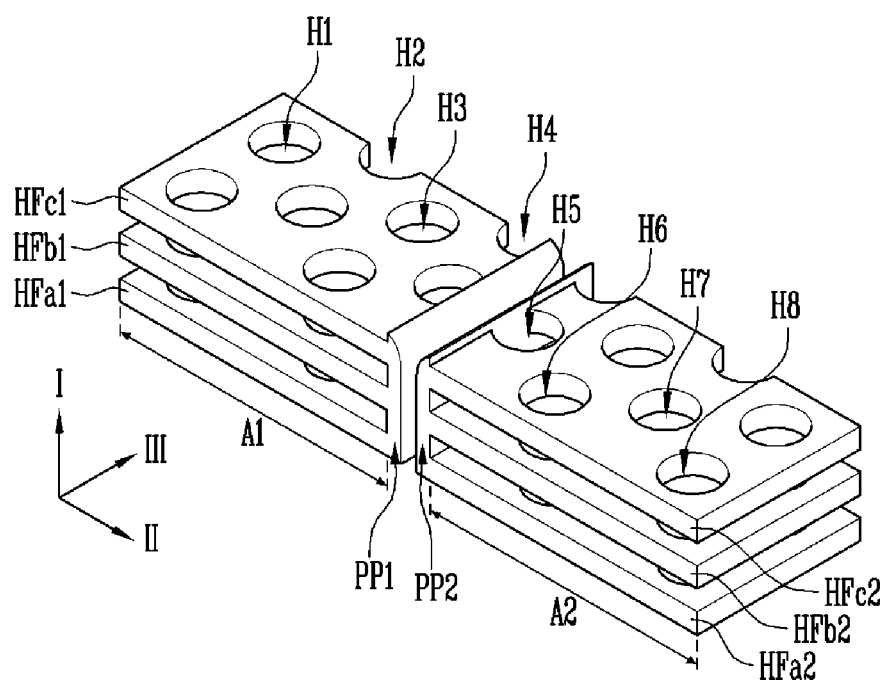
FIG. 4 is a perspective view illustrating structures of half conductive patterns, vertical conductive patterns, and holes according to an embodiment of the present disclosure.

FIG. 4 is a perspective view illustrating a structure of half conductive patterns, vertical conductive patterns, and holes according to an embodiment of the present disclosure. The structure illustrated in FIG. 4 may be applied to the first and second drain select lines illustrated in FIGS. 2A and 2B, or be applied to the first and second source select lines illustrated in FIGS. 3A and 3B.

Referring to FIG. 4, first half conductive patterns HFa1 to HFc1 extending toward a first region A1 from a first vertical conductive pattern PP1 may be penetrated by holes H1 to H4 of first to Kth columns. Second half conductive patterns HFa2 to HFc2 extending toward a second region A2 from a second vertical conductive pattern PP2 may be penetrated by holes H5 to H8 of (K+1)th to 2Kth columns. The arrangement of the holes H1 to H8 of the first to 2Kth columns are identical to that of the cell plugs of the first to 2Kth columns described in FIGS. 2A to 3B. The first channel pillars included in the first to Kth columns 1 to 4 illustrated in FIGS. 2A to 3B, are disposed in the holes H1 to H4 of the first to Kth columns. The second channel pillars included in the (K+1)th to 2K columns 5 to 8 illustrated in FIGS. 2A to 3B, are disposed in the holes H5 to H8 of the (K+1)th to 2Kth columns.

The hole H4 of the Kth column among the holes H1 to H4 of the first to Kth columns, which penetrate the first half conductive patterns HFa1 to HFc1, is disposed adjacent to the first vertical conductive pattern PP1. The hole H5 of the (K+1)th column among the holes (H5 to H8) of the (K+1)th to 2Kth columns, which penetrate the second half conductive patterns HFa2 to HFc2, is disposed adjacent to the second vertical conductive pattern PP2.

The holes H1 to H8 of the first to 2Kth columns may be spaced apart from each other at a minimized distance to achieve a high integration of the semiconductor device. In particular, the hole H4 of the Kth column, which is disposed adjacent to the first vertical conductive pattern PP1, may include a sidewall that forms a common surface with a sidewall of the first vertical conductive pattern PP1. In addition, the hole H5 of the (K+1)th column, which is disposed adjacent to the second vertical conductive pattern PP2, may include a sidewall that forms a common surface of a sidewall of the second vertical conductive pattern PP2.

The holes H1 to H3 of the first to (K−1)th columns are disposed to be spaced apart from the first vertical conductive pattern PP1, and the holes H6 to H8 of the (K+2)th to 2Kth columns are disposed to be spaced apart from the second vertical conductive pattern PP2.

The first vertical conductive pattern PP1 may further protrude in a first direction I than the uppermost half conductive pattern HFc1 among the first half conductive patterns HFa1 to HFc1. The second vertical conductive pattern PP2 may further protrude in the first direction I than the uppermost half conductive pattern HFc2 among the second half conductive patterns HFa2 to HFc2. Although not illustrated in the drawing, the heights of the first vertical conductive pattern PP1 and the second vertical conductive pattern PP2 may be controlled not to further protrude than the uppermost half conductive patterns HFc1 and HFc2, respectively. For example, the heights of the first vertical conductive pattern PP1 and the second vertical conductive pattern PP2 may be controlled to be the same as those of upper surfaces of the uppermost half conductive patterns HFc1 and HFc2, respectively. Alternatively, the heights of the first vertical conductive pattern PP1 and the second vertical conductive pattern PP2 may be controlled to be lower than those of the upper surfaces of the uppermost half conductive patterns HFc1 and HFc2, respectively.

Figure 5A:
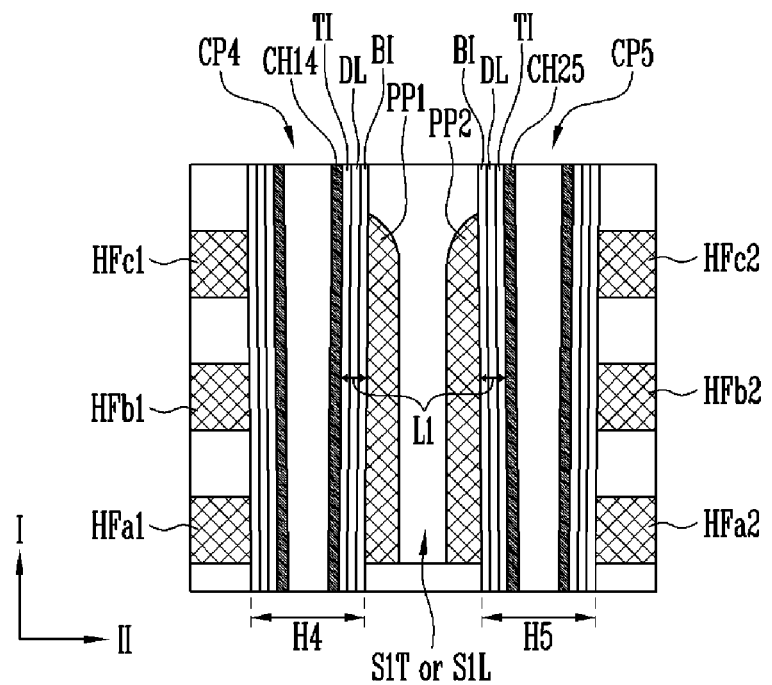
FIGS. 5A and 5B are enlarged sectional views illustrating an arrangement of vertical conductive patterns and cell plugs according to an embodiment of the present disclosure.
Figure 5B:
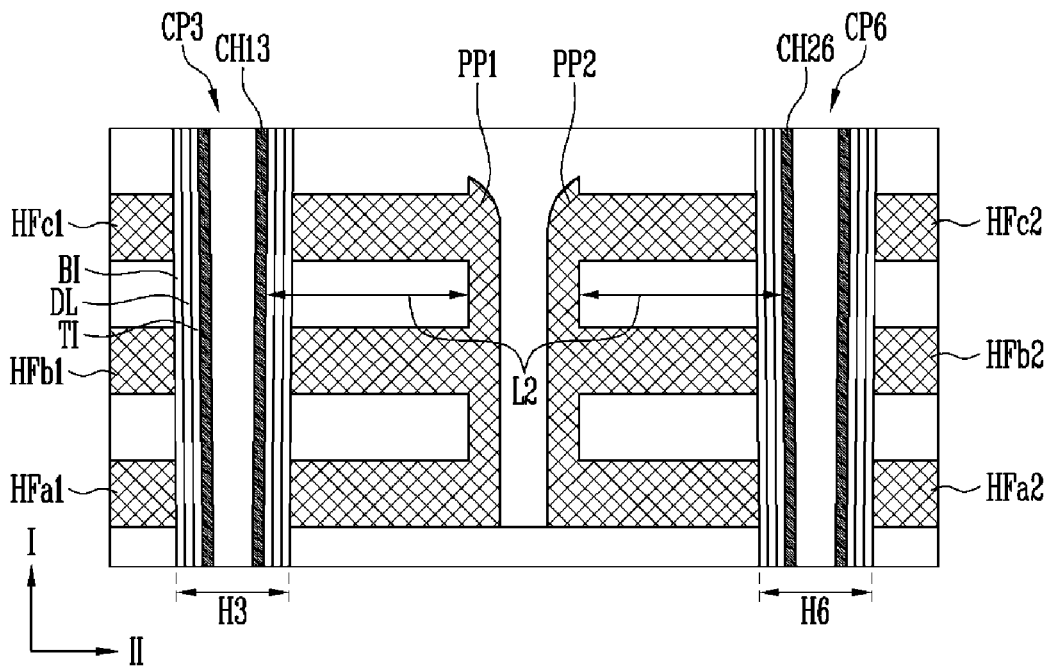

FIGS. 5A and 5B are enlarged sectional views illustrating an arrangement of vertical conductive patterns and cell plugs according to an embodiment of the present disclosure. Cell plugs illustrated in FIG. 5A correspond to the Kth and (K+1)th columns 4 and 5 illustrated in FIGS. 2A to 3B. Cell plugs illustrated in FIG. 5B correspond to the (K−1)th and (K+2)th columns 3 and 6 illustrated in FIGS. 2A to 3B. In FIGS. 5A and 5B, for convenience of description, the cell plug of the Kth column is designated by CP4, the cell plug of the (K+1)th column is designated by CP5, the cell plug of the (K−1)th column is designated as CP3, and the cell plug of the (K+2)th column is designated as CP6. Also, in FIGS. 5A and 5B, first channel pillars of the cell plug CP4 of the Kth column and the cell plug CP3 of the (K−1)th column are designated as CH14 and CH13, respectively, and second channel pillars of the cell plug CP5 of the (K+1)th column and the cell plug CP6 of the (K+2)th column are designated as CH25 and CH26.

Referring to FIG. 5A and 5B, the first channel pillars CH14 and CH13 are disposed in the holes H4 and H3 that penetrate the first half conductive patterns HFa1 to HFc1, and the second channel pillars CH25 and CH26 are disposed in the holes H5 and H6 that penetrate the second half conductive patterns HFa2 to HFc2. Each of the first channel pillars CH14 and CH13 and the second channel pillars CH25 and CH26 is surrounded by a multi-layered memory pattern including a tunnel insulating layer TI, a data storage layer DL, and a blocking insulating layer BI as described in FIGS. 2A to 3B.

In an embodiment of the present disclosure, the cell plugs CP3, CP4, CP5, and CP6 may be disposed as dense as possible to achieve a high integration of the semiconductor device. In this case, as illustrated in FIG. 5A, a portion of the sidewall of the hole H4 of the Kth column, which is adjacent to the first slit S1T or S1L, may form a common surface with the sidewall of the first vertical conductive pattern PP1, and a portion of the sidewall of the hole H5 of the (K+1)th column, which is adjacent to the first slit S1T or S1L, may form a common surface with the sidewall of the second vertical conductive pattern PP2. In an embodiment, for example, as illustrated in FIG. 5A, a portion of the sidewall of the block insulating layer BI surrounding the first channel pillar CH14 located in the hole H4 of the Kth column, which is adjacent to the first slit S1T or S1L, may form a common surface with the sidewall of the first vertical conductive pattern PP1, and a portion of the sidewall of the block insulating layer BI surrounding the second channel pillar CH25 located in the hole H5 of the (K+1)th column, which is adjacent to the first slit S1T or S1L, may form a common surface with the sidewall of the second vertical conductive pattern PP2.

Referring to FIG. 5A, the first vertical conductive pattern PP1 and the second vertical conductive pattern PP2, which are formed on both sidewalls of the first slit S1T or S1L improve electrical characteristics of select transistors defined by the first channel pillar CH14 of the Kth column and the second channel pillar CH25 of the (K+1)th column, which are adjacent to the first slit S1T or S1L.

Unlike the embodiment of the present disclosure, the first vertical conductive pattern PP1 and the second vertical conductive pattern PP2 may be omitted, and portions of the sidewalls of the hole H4 of the Kth column and the hole H5 of the (K+1)th column, which face the first slit S1T or S1L, may not overlap with the conductive patterns. In this case, during an operation of the semiconductor device, any channel is not formed at portions of the first channel pillar CH14 of the Kth column and the second channel pillar CH25 of the (K+1)th column, which face the first slit S1T or S1L, and therefore, an operation failure may be caused.

In the embodiment of the present disclosure, the operational reliability of the semiconductor device can be improved by ensuring an off characteristic and on current of the select transistor defined by the first channel pillar CH14 of the Kth column through the first vertical conductive pattern PP1 opposite to the first channel pillar CH14 of the Kth column, which faces the first slit S1T or S1L. Also, in the embodiment of the present disclosure, the operational reliability of the semiconductor device can be improved by ensuring an off characteristic and on current of the select transistor defined by the second channel pillar CH25 of the (K+1)th column through the second vertical conductive pattern PP2 opposite to the second channel pillar CH25 of the (K+1)th column, which faces the first slit S1T or S1L.

The first channel pillar CH14 of the Kth column and the first vertical conductive pattern PP1 may be spaced apart from each other at a first distance L1. In addition, the second channel pillar CH25 of the (K+1)th column and the second vertical conductive pattern PP2 may be spaced apart from each other at the first distance L1. In an embodiment, for example, the first channel pillar CH14 may be spaced apart by the first distance L1 from the sidewall of the first vertical conductive pattern PP1 due to the tunnel insulating layer TI, the data storage layer DL, and the blocking insulating layer BI surrounding the first channel pillar CH14. In an embodiment, for example, the second channel pillar CH25 may be spaced apart by the first distance L1 from the sidewall of the second vertical conductive pattern PP2 due to the tunnel insulating layer TI, the data storage layer DL, and the blocking insulating layer BI surrounding the second channel pillar CH25. In an embodiment, for example the first distance L1 between the first channel pillar CH14 and the first vertical conductive pattern PP1 may be substantially equal to another distance L1 between the second channel pillar CH25 and the second vertical conductive pattern PP2.

Referring to FIG. 5B, the other first channel pillars (e.g., CH13) except the first channel pillar CH14 of the Kth column described in FIG. 5A may be spaced apart from the first vertical conductive pattern PP1 at a second distance (e.g., L2) larger than the first distance L1. The other second channel pillars (e.g., CH26) except the second channel pillar CH25 of the (K+1)th column described in FIG. 5A may be spaced apart from the second vertical conductive pattern PP2 at the second distance (e.g., L2) larger than the first distance L1.

Referring to FIGS. 5A and 5B, the first half conductive patterns HFa1 to HFc1 may be disposed at different heights. The second half conductive pattern HFa2 to HFc2 may be disposed at different heights. The first half conductive patterns HFa1 to HFc1 and the second half conductive pattern HFa2 to HFc2 are not patterned in a step structure, and contact plugs (not illustrated) may be in contact with one layer among the first half conductive patterns HFa1 to HFc1 and one layer among the second half conductive pattern HFa2 to HFc2, respectively.

According to the embodiment of the present disclosure, the first half conductive patterns HFa1 to HFc1 are connected to each other by the first vertical conductive pattern PP1 disposed on the sidewall of the first slit S1T or S1L. Accordingly, as an electrical signal is applied to any one pattern among the first half conductive patterns HFa1 to HFc1, regardless of the stacking number of the first half conductive patterns HFa1 to HFc1, the electrical signal can be transmitted to all of the first half conductive patterns HFa1 to HFc1 and the first vertical conductive pattern PP1. Thus, as an electrical signal is applied to any one pattern among the second half conductive patterns HFa2 to HFc2, the electrical signal can be transmitted to all of the second half conductive patterns HFa2 to HFc2 and the second vertical conductive pattern PP2.

FIGS. 6A to 6K are sectional views illustrating a manufacturing method of a semiconductor device according to an embodiment of the present disclosure. FIGS. 6A to 6K illustrate an example of a manufacturing method of the semiconductor device illustrated in FIG. 2A.

Figure 6A:
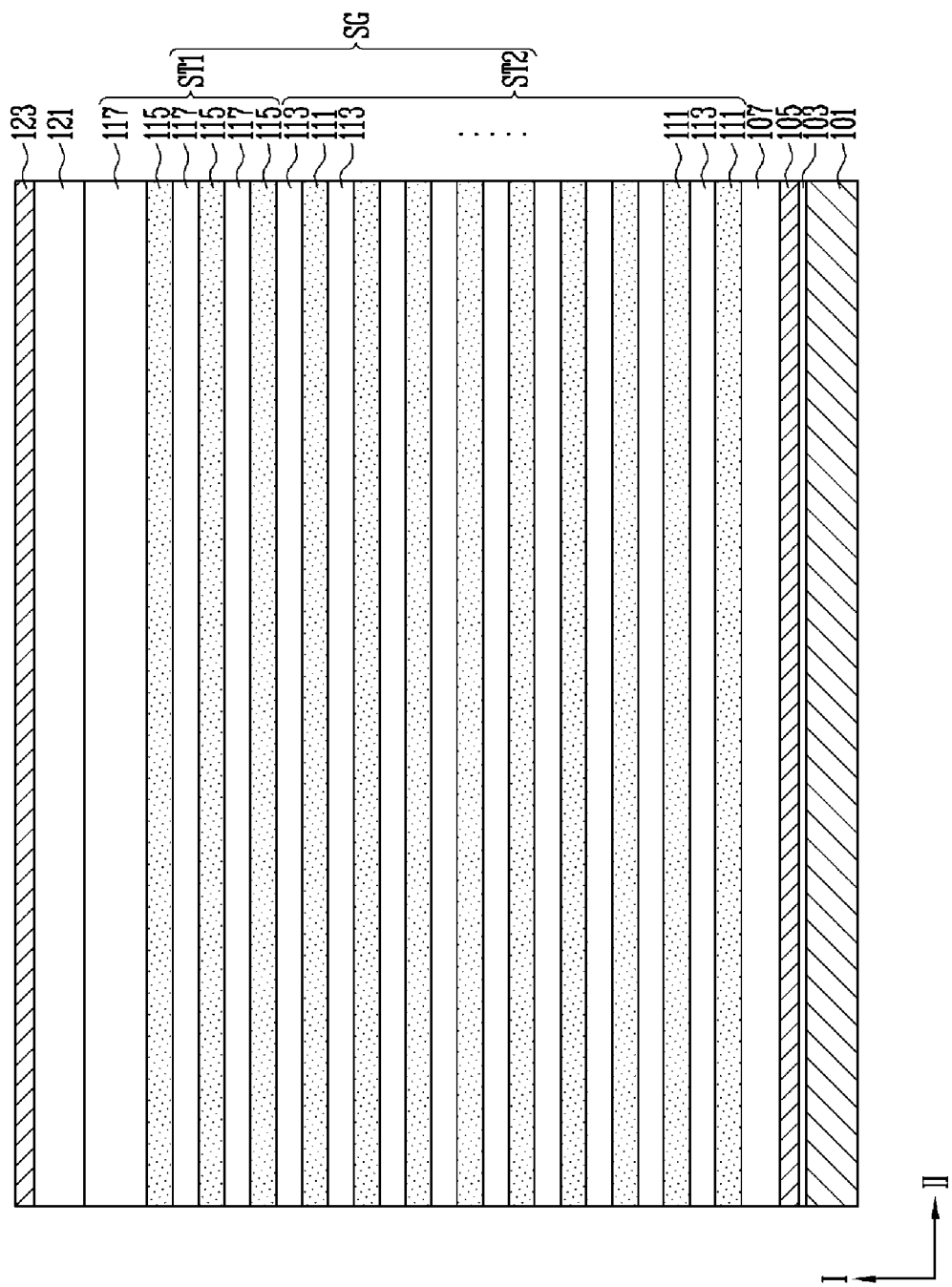

Referring to FIG. 6A, a first source layer 101 is provided. Although not illustrated in the drawing, the first source layer 101 may be formed on a substrate having a driving circuit formed thereon. The first source layer 101 may be a doped silicon layer including a first conductivity type impurity. The first conductivity type impurity may be an n-type impurity. Before the first source layer 101 is formed, a well structure (not illustrated) including a second conductivity type impurity different from the first conductivity type impurity is disposed on the substrate. In this case, the first source layer 101 is disposed on the well structure. Although not illustrated in the drawings, transistors constituting the driving circuit, an insulating layer covering the driving circuit, and contact plugs and routing lines connected to the driving circuit may be disposed between the substrate and the well structure. In the above, the second conductivity type impurity may be a p-type impurity.

Subsequently, a sacrificial source layer 105 may be formed on the first source layer 101. The sacrificial source layer 105 may be formed of a material layer having an etching rate different from that of the first source layer 101. For example, the sacrificial source layer 105 may be an undoped silicon layer. Before the sacrificial source layer 105 is formed, a protective layer 103 may be first formed on the first source layer 101. The protective layer 103 may be formed of a material layer having an etching rate different from those of the first source layer 101 and the sacrificial source layer 105. For example, the protective layer 103 may be formed of an oxide layer.

After that, a source insulating layer 107 may be formed on the sacrificial source layer 107. Subsequently, a stack group SG may be formed on the source insulating layer 107. The stack group SG may include a first stack structure ST1 and a second stack structure ST2. The first stack structure ST1 is defined as a stack structure for half conductive patterns, and the second stack structure ST2 is defined as a stack structure for horizontal conductive patterns.

The first stack structure ST1 may be formed by alternately stacking at least one pair of first and second material layers 115 and 117. The second stack structure ST2 may be formed by alternately stacking third material layers 111 and fourth material layers 113. The second stack structure ST2 may be formed before the first stack structure ST1 is formed.

The first material layer 115 and the third material layer 111 may be formed of the same material. The second material layer 117 and the fourth material layer 113 may be formed of the same material. The second material layer 117 and the fourth material layer 113 may be formed of a material different from that of the first material layer 115 and the third material layer 111.

In a first case, the second material layer 117 and the fourth material layer 113 may be formed of a first insulating material, and the first material layer 115 and the third material layer 111 may be formed of a second insulating material for sacrificial layers, which has an etching rate different form that of the second material layer 117 and the fourth material layer 113. The first insulating material may be selected among various materials that can serve as an interlayer insulating layer. For example, the first insulating material may include a silicon oxide layer. The second insulating material may be selected among various materials each having a large difference in etching rate between the second insulating material and the first insulating material. For example, the second insulating material may include a silicon nitride layer.

In a second case, the second material layer 117 and the fourth material layer 113 may be formed of the above-described first insulating material, and the first material layer 115 and the third material layer 111 may be formed of a conductive material. The conductive material may include at least one of a doped silicon layer, a metal silicide layer, and a metal layer. In order to achieve low-resistance wiring, a low-resistance metal such as tungsten may be used as the conductive material.

In a third case, the first material layer 115 and the third material layer 111 may be formed of a gate conductive material, and the second material layer 117 and the fourth material layer 113 may be formed of a sacrificial conductive material having an etching rate different from that of the first material layer 115 and the third material layer 111. The gate conductive material may include at least one of a doped silicon layer, a metal silicide layer, and a metal layer. The sacrificial conductive material may be selected among various materials each having a difference in etching rate between the sacrificial conductive material and the gate conductive material. For example, the gate conductive material may be formed of a doped silicon layer, and the sacrificial conductive material may be formed of an undoped silicon layer.

Subsequently, a mask layer 121 and an etch stop layer 123 may be sequentially stacked on the stack group SG. The mask layer 121 may include a nitride layer. The etch stop layer 123 may include a silicon layer.

Referring to FIG. 6B, a photoresist pattern 127 is formed on the etch stop layer 123 by using a photolithography process. After that, the etch stop layer 123, the mask layer 121, and the first stack structure ST1 are etched through an etching process using the photoresist pattern 127 as an etching barrier. Accordingly, a first preliminary slit 129A is formed. The first preliminary slit 129A may be formed in a wave shape or a straight shape along the third direction III illustrated in FIGS. 2A to 3B.

The first preliminary slit 129A is formed to a depth where an upper surface of the first material layer 115 disposed as the lowermost layer of the first stack structure ST1 is exposed therethrough, and may not completely penetrate the first stack structure ST1. That is, one layer of the first material layer 115 may remain between the second stack structure ST2 and the first preliminary slit 129A.

Figure 6C:
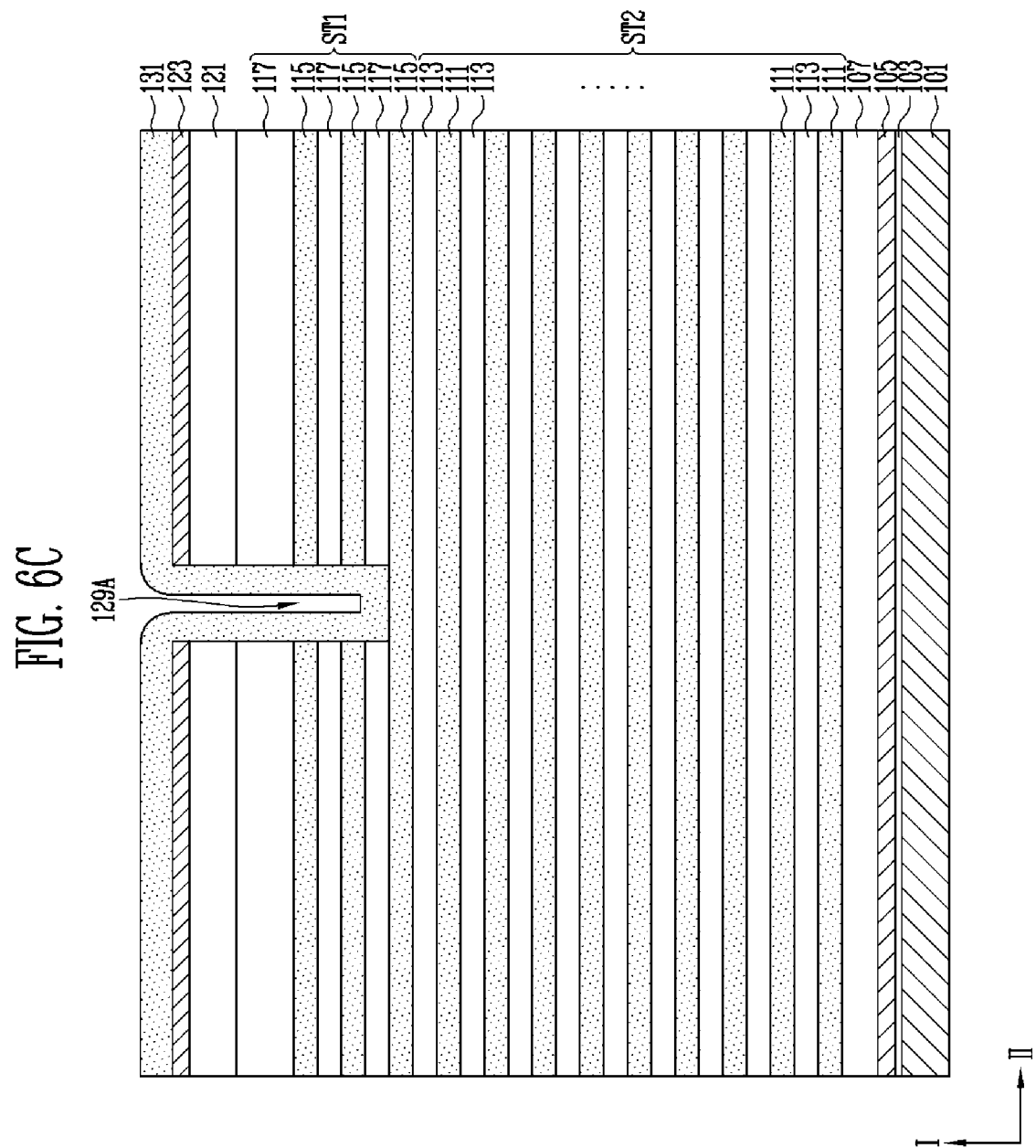

Referring to FIG. 6C, after the first preliminary slit 129A is formed, the etch stop layer 123 may be exposed by removing the photoresist pattern. Subsequently, a fifth material layer 131 is formed on the surface of the first preliminary slit 129A defined by the remaining first stack structure ST1, the mask layer 121, and the etch stop layer 123. The fifth material layer 131 is formed to a thickness where a central region of the first preliminary slit 129A is not filled therewith, and may extend on an upper surface of the etch stop layer 123.

In the first case described in FIG. 6A, the fifth material layer 131 may be formed of a sacrificial material having an etching rate different from that of the second material layer 117 and the fourth material layer 113. The sacrificial material may be formed as the second insulating material described in FIG. 6A. Alternatively, in the first case described in FIG. 6A, the fifth material layer 131 may be formed of a first conductive material having an etching rate different from that of the second material layer 117 and the fourth material layer 113. In the second and third cases described in FIG. 6A, the fifth material layer 131 may also be formed of the first conductive material. The first conductive material may be selected among various conductive materials such as a doped silicon layer, a metal layer, and a metal silicide layer.

If the fifth material layer 131 is formed of a first conductive material, a barrier layer (not illustrated) may be further formed before the first conductive material is formed. In this case, the fifth material layer 113 may be formed on the barrier layer. The barrier layer prevents direct contact between the first conductive material and a first insulating material formed in a layer in which the second material layer 117 is disposed. The barrier layer may include a titanium nitride layer, a tungsten nitride layer, a tantalum nitride layer, and the like.

Referring to FIG. 6D, the fifth material layer is etched by using an etch-back process. Accordingly, the fifth material layer remains as vertical patterns 131P on both sidewalls of the first preliminary slit 129A, and the upper surface of the etch stop layer 123 is exposed. The vertical patterns 131P may remain with a height lower than that of the first preliminary slit 129A.

The etch-back process may be controlled such that a slit extending part 129B extending from the first preliminary slit 129A can be defined by etching the first material layer 115 disposed as the lowermost layer of the first stack structure ST1. Alternatively, the slit extending part 128B extending from the first preliminary slit 129A may be formed by etching the first material layer 115 disposed as the lowermost layer of the first stack structure ST1 through a separate etching process distinguished from the etch-back process. The slit extending part 129B may allow an upper surface of the fourth material layer 113 formed as the uppermost layer of the second stack structure ST2 to be exposed therethrough.

A first slit 129 including the first preliminary slit 129A and the slit extending part 129B may allow the vertical patterns 131P to be isolated from each other. Also, the first slit 129 may isolate the first stack structure ST1 into a first sub-stack structure SUB1 and a second sub-stack structure SUB2. The vertical patterns 131P are disposed on sidewalls of the first and second sub-stack structures SUB1 and SUB2, respectively.

Figure 6E:
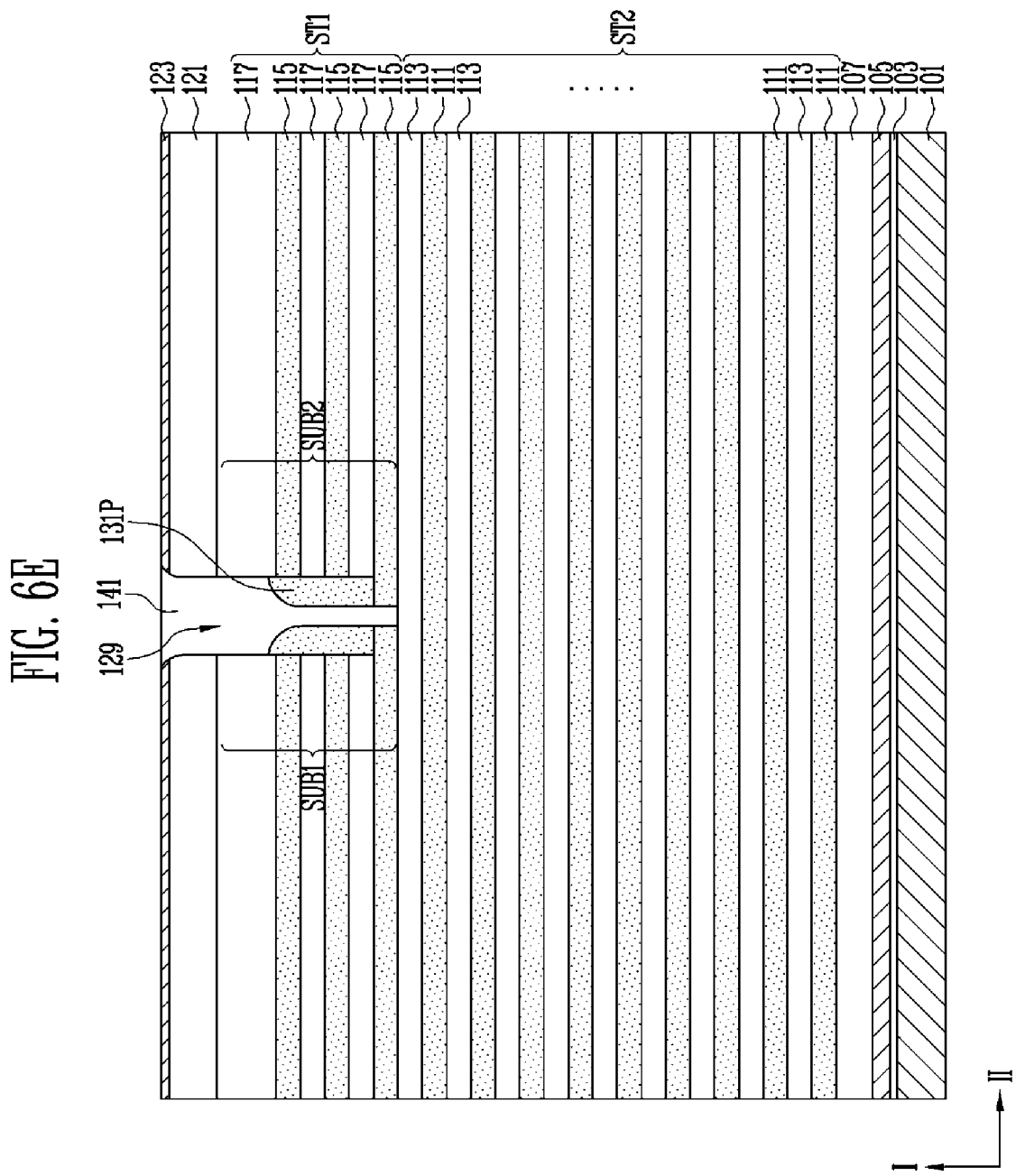

Referring to FIG. 6E, a slit insulating layer 141 filled in the first slit 129 is formed. The slit insulating layer 141 may be formed of an oxide layer. The slit insulating layer 141 may be planarized through a planarizing process that is stopped when the etch stop layer 123 is exposed. A chemical mechanical polishing (CMP) process may be used as the planarizing process.

The slit insulating layer 141 isolates between the vertical patterns 131P. The slit insulating layer 141 isolates between the first sub-stack structure SUB1 and the second sub-stack structure SUB2.

Figure 6F:
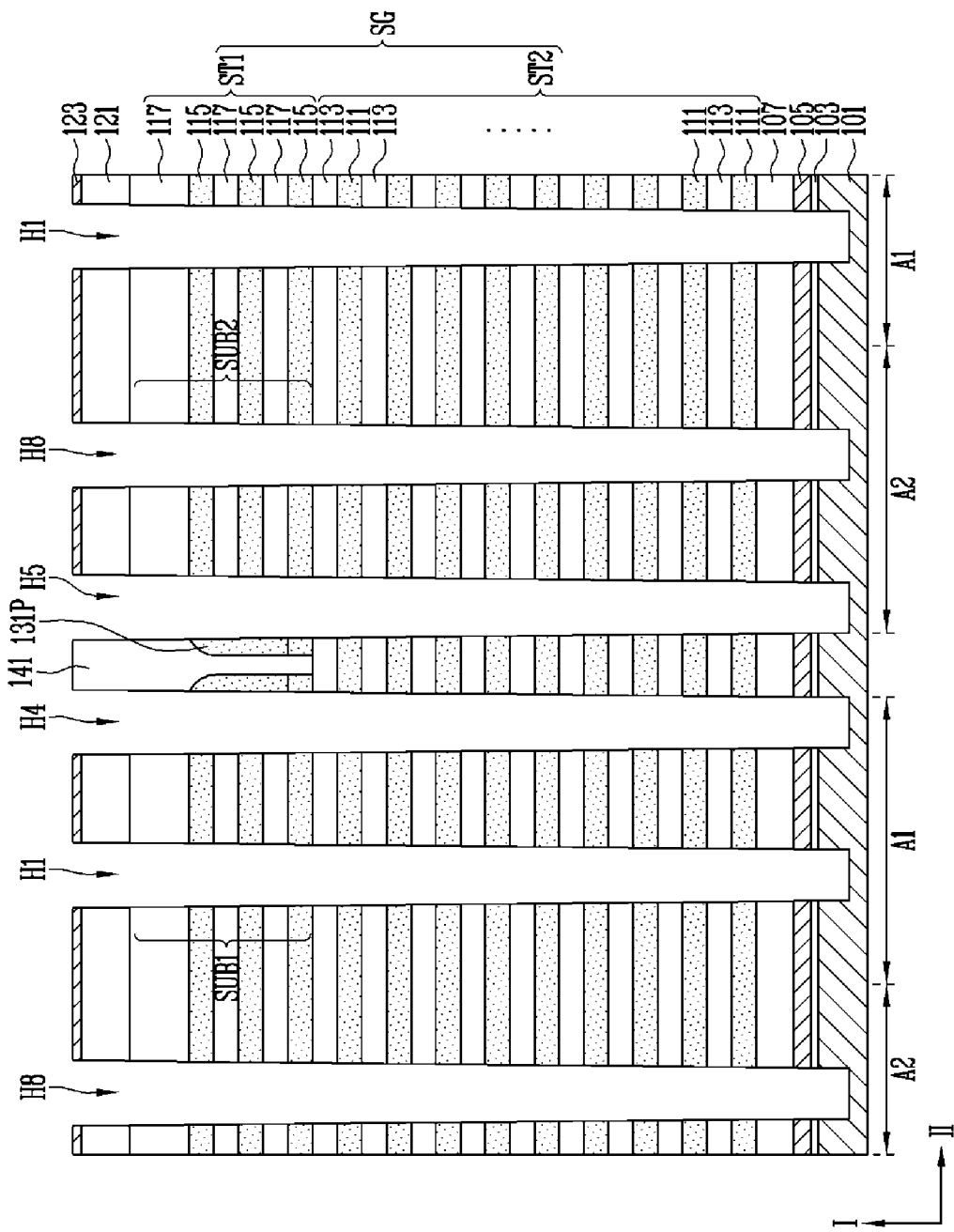

Referring to FIG. 6F, first regions A1 and second regions A2, which are alternately disposed in a second direction II, may be defined in the stack group SG including the first stack structure ST1 and the second stack structure ST2. The slit insulating layer 141 is disposed at a boundary between the first region A1 and the second region A2 between the first sub-stack structure SUB1 and the second sub-stack structure SUB2. Each of the first sub-stack structure SUB1 and the second sub-stack structure SUB2 may include one first region A1 and one second region A2.

After the slit insulating layer 141 is formed, a photoresist pattern (not illustrated) that defines a layout of holes H1 to H8 of first to 2Kth columns may be formed on the etch stop layer 123 by using a photolithography process. After that, the holes H1 to H8 of the first to 2Kth columns are formed by etching the first sub-stack structure SUB1, the second sub-stack structure SUB2, and the second stack structure ST2 through an etching process using the photoresist pattern as an etching barrier. After the holes H1 to H8 of the first to 2Kth columns are formed, the photoresist pattern may be removed.

The holes H1 to H8 of the first to 2Kth columns may penetrate the etch stop layer 123 and the mask layer 121. The holes H1 to H8 of the first to 2Kth columns may extend to the inside of the first source layer 101 by penetrating the source insulating layer 107, the sacrificial source layer 105, and the protective layer 103.

The holes H1 to H8 of the first to 2Kth columns may be arranged in zigzag as described in FIG. 4. The holes H1 to H4 of the first to Kth columns are disposed in each of the first regions A1, and the holes H5 to H8 of the (K+1)th to 2Kth columns are disposed in each of the second regions A2. FIG. 6F illustrates holes H1 of the first column, a hole H4 of the Kth column, a hole H5 of the (K+1)th column, and holes H8 of the 2Kth column, which correspond to the perforated line.

The holes H1 to H8 of the first to 2Kth columns may be spaced part from each other at a minimized distance so as to achieve a high integration of the semiconductor device. In this case, any dummy hole for ensuring a space for securing an overlay margin between the hole H4 of the Kth column and the hole H5 of the (K+1)th column, which are adjacent to the slit insulating layer 141, is not disposed. If any dummy hole is not disposed, the hole H4 of the Kth column and the hole H5 of the (K+1)th column can be disposed as close as possible, thereby efficiently utilizing a horizontal space.

When the hole H4 of the Kth column and the hole H5 of the (K+1)th column are disposed close to each other, the overlay margin may be not secured. Therefore, sidewalls of the hole H4 of the Kth column and the hole H5 of the (K+1)th column, which face the slit insulating layer 141, may be not covered by the first sub-stack structure SUB1 and the second sub-stack structure SUB2, and may form common surfaces with both sidewalls of the slit insulating layer 141 and sidewalls of the vertical patterns 131P.

Referring to FIG. 6G, cell plugs CP1 to CP8 of the first to 2Kth columns are formed in the holes H1 to H8 of the first to 2Kth columns illustrated in FIG. 6F. An arrangement of the cell plugs CP1 to CP8 of the first to 2Kth columns is identical to that of the holes H1 to H8 of the first to 2Kth columns described in FIG. 6F.

Each of the cell plugs CP1 to CP8 of the first to 2Kth columns may include a multi-layered memory layer 161, a channel pillar 163, a core insulating layer 165, and a capping conductive pattern 167. The multi-layered memory layer 161 may include a blocking insulating layer, a data storage layer, and a tunnel insulating layer as described in FIGS. 2A to 3B and FIGS. 5A and 5B.

The multi-layered memory layer 161 may be formed to surround an outer wall of the channel pillar 163. The core insulating layer 165 and the capping conductive pattern 167 may be disposed in a central region defined by the channel pillar 163. The capping conductive pattern 167 may be disposed on the core insulating layer 165.

The step of forming the cell plugs CP1 to CP8 may include a step of sequentially stacking the blocking insulating layer, the data storage layer, the tunnel insulating layer, and a channel layer along surfaces of the holes H1 to H8 illustrated in FIG. 6F and a surface of the etch stop layer 123. The channel layer may be formed of a semiconductor layer. For example, the channel layer may include a silicon layer. The step of forming the cell plugs CP1 to CP8 may include a step of filling the core insulating layer 165 in central regions of the holes H1 to H8 opened by the channel layer. The core insulating layer 165 may be recessed such that its height is lower than that of the holes H1 to H8. The step of forming the cell plugs CP1 to CP8 may include a step of forming a capping layer that fills in upper end center regions of the holes H1 to H8, which are defined by the channel layer and the core insulating layer 165. The capping layer may be formed of a semiconductor layer doped with a first conductivity type impurity. For example, the capping layer may be formed of a doped silicon layer doped with an n-type impurity. The step of forming the cell plugs CP1 to CP8 may include a step of performing a planarizing process such as a CMP process until the mask layer 121 is exposed. Through the planarizing process, the capping layer remains as the capping conductive pattern 167 in only the holes H1 to H8, the channel layer remains as the channel pillar 163 in only the holes H1 to H8, and the blocking insulating layer, the data storage layer, and the tunnel insulating layer remain as the multi-layered memory layer 161 in only the holes H1 to H8. The etch stop layer 123 may be removed through the planarizing process and the mask layer 121 may be exposed.

The channel pillar 163 may extend down to the inside of the first source layer 101 by penetrating the second stack structure ST2 including the third material layers 111 and the fourth material layers 113 from the first sub-stack structure SUB1 and the second sub-stack structure SUB2. A side wall of the channel pillar 163 of each of the cell plug CP4 of the Kth column and the cell plug CP5 of the (K+1)th column, which face the slit insulating layer 141, is not covered by the first sub-stack structure SUB1 and the second sub-stack structure SUB2, may be covered by the vertical patterns 131P.

Referring to FIG. 6H, the mask layer 121 illustrated in FIG. 6G, and an upper insulating layer 171 that covers the cell plugs CP1 to CP8 and the slit insulating layer 141 may be formed on the first sub-stack structure SUB1 and the second sub-stack structure SUB2. Although not illustrated in the drawing, a step structure that defines a region in which contact plugs are to be in contact with at least a portion of the second stack structure ST2 may be formed by patterning the first sub-stack structure SUB1, the second sub-stack structure SUB2, and the second stack structure ST2 before the upper insulating layer 171. The upper insulating layer 171 may be formed to cover the step structure, and a surface of the upper insulating layer 171 may be planarized.

Referring to FIG. 6I, second slits 175 are formed between cell plugs CP1 of first columns and cell plugs CP8 of Kth columns, which are adjacent to each other. One second slit 175 may expose the sacrificial source layer 105 therethrough by penetrating the first sub-stack structure SUB1 and the second stack structure ST2, which are illustrated in FIG. 6H. Another second slit 175 may expose the sacrificial source layer 105 therethrough by penetrating the second sub-stack structure SUB2 and the second stack structure ST2, which are illustrated in FIG. 6H.

A subsequent process may be variously performed. FIGS. 6I and 6J illustrate an example of a subsequent process when the second material layer 117 and the fourth material layer 113 are formed of a first insulating material like the first case described in FIG. 6A, the first material layer (115 of FIG. 6A) and the third material layer (111 of FIG. 6A) are formed of a second insulating material for sacrificial layers like the first case described in FIG. 6A, and the vertical patterns (131P of FIG. 6H) are formed of a second insulating material for sacrificial layers.

Referring to FIG. 6I, first and second horizontal openings OP_H1 and OP_H2 and vertical openings OP_P are defined by selectively removing the first material layer, the third material layer, and the vertical patterns through the second slits 175. The first horizontal openings OP_H1 are defined in regions in which the first material layers are removed. The second horizontal openings OP_H2 are defined in regions in which the third material layers are removed. The vertical openings OP_P are defined in regions in which the vertical patterns are removed. Sidewalls of the cell plug CP4 of the Kth column and the cell plug CP5 of the (K+1)th column, which face the slit insulating layer 141, may be exposed by the vertical openings OP_P. The first horizontal openings OP_H1 may be defined in a structure in which they are symmetrical to each other with the slit insulating layer 141 interposed therebetween. The second horizontal openings OP_H2 extend to overlap with the slit insulating layer 141 under the slit insulating layer 141.

Referring to FIG. 6J, the first and second horizontal openings OP_H1 and OP_H2 and the vertical openings OP_P, which are illustrated in FIG. 6I, may be filled with a second conductive material 177. The second conductive material 177 may include at least one of a doped silicon layer, a metal silicide layer, and a metal layer. In order to achieve low-resistance wiring, a low-resistance metal such as tungsten may be used as the second conductive material 177. Before the second conductive material 177 is formed, a barrier layer (not illustrated) may be further formed. The barrier layer prevents direct contact between a first multi-layered memory pattern ML1 and the second conductive material 177. The barrier layer may include a titanium nitride layer, a tungsten nitride layer, a tantalum nitride layer, and the like.

The second conductive material 177 disposed in each of the first horizontal openings OP_H1 is defined as a half conductive pattern 177HF. The second conductive material 177 disposed in each of the second horizontal openings OP_H2 is defined as a horizontal conductive pattern 177HR. The second conductive material 177 disposed in each of the vertical openings OP_P is defined as a vertical conductive pattern 177P.

In the example described in FIGS. 6I and 6J, the first material layers, the third material layers, and the vertical patterns is replaced with the second conductive material 177 through the second slits 175, so that the gate groups GG illustrated in FIG. 2A can be formed.

As another example, the second material layer and the fourth material layer may be formed of a first insulating material, the first material layer and the third material layer may be formed of a conductive material, and the vertical patterns may be formed of a first conductive material. In this case, although a process of replacing the first material layer, the third material, and the vertical patterns with a second conductive material is omitted, the first material layer and the third material layer may be isolated into the gate groups GG illustrated in FIG. 2A through the second slits, and the vertical patterns may be used as vertical conductive patterns that connect the half conductive patterns.

As still another example, the first material layer and the third material layer may be formed of a gate conductive material, the second material layer and the fourth material layer may be formed of a sacrificial conductive material, and the vertical patterns may be formed of a first conductive material. In this case, although a process of replacing the first material layer, the third material, and the vertical patterns with a second conductive material is omitted, the first material layer and the third material layer may be isolated into the gate groups GG illustrated in FIG. 2A through the second slits, and the vertical patterns may be used as vertical conductive patterns that connect the half conductive patterns. In addition, the sacrificial conductive material constituting the second material layer and the fourth material layer may be replaced with a first insulating material through the second slits.

After the gate groups are formed in various manners as described above, the source sacrificial layer and the protective layer may be removed through the second slits 175 as illustrated in FIG. 6J. Accordingly, a horizontal space 181 is exposed between the source insulating layer 107 and the first source layer 101. Subsequently, as the multi-layered memory layer of each of the cell plugs CP1 to CP8, which is exposed through the horizontal space 181, is etched, the multi-layered memory layer is isolated into the first multi-layered memory pattern ML1 and a second multi-layered memory pattern ML2, and a sidewall of the channel pillar 163 is exposed.

Referring to FIG. 6K, the horizontal space 181 illustrated in FIG. 6J is filled with a second source layer 185. The second source layer 185 may be in direct contact with the first source layer 101 and the channel pillar 163. The second source layer 185 may be formed of a semiconductor layer. For example, the second source layer 185 may be formed of a silicon layer. The second source layer 185 may include a first conductive type dopant diffused from the first source layer 101. The first and second source layers 101 and 185 may define the source region SA illustrated in FIG. 2A.

Figure 7A:
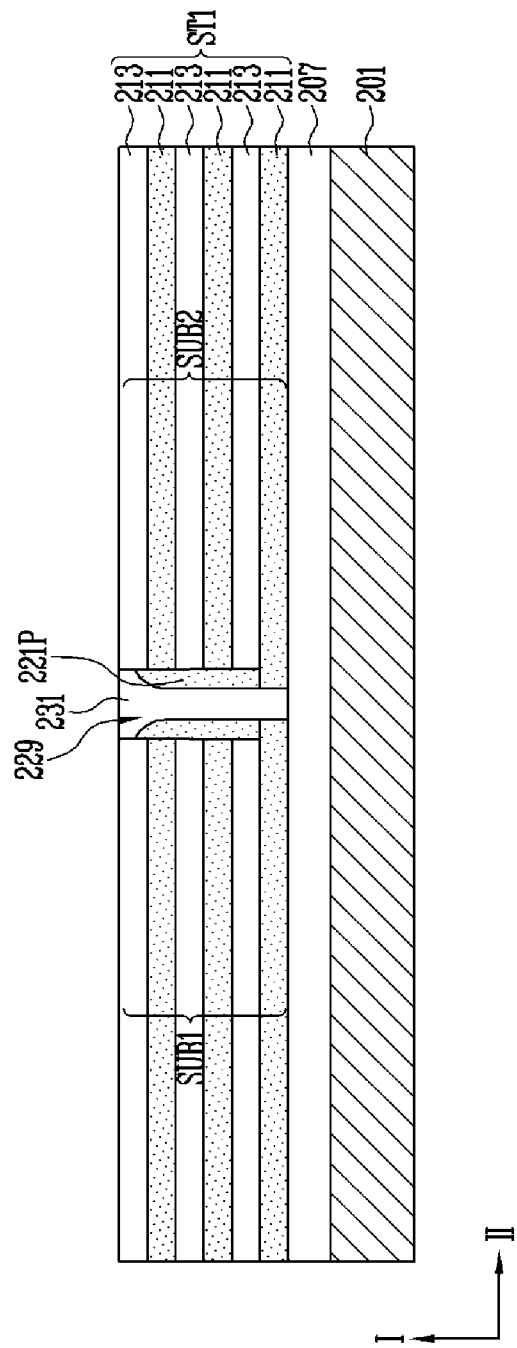
Figure 7C:
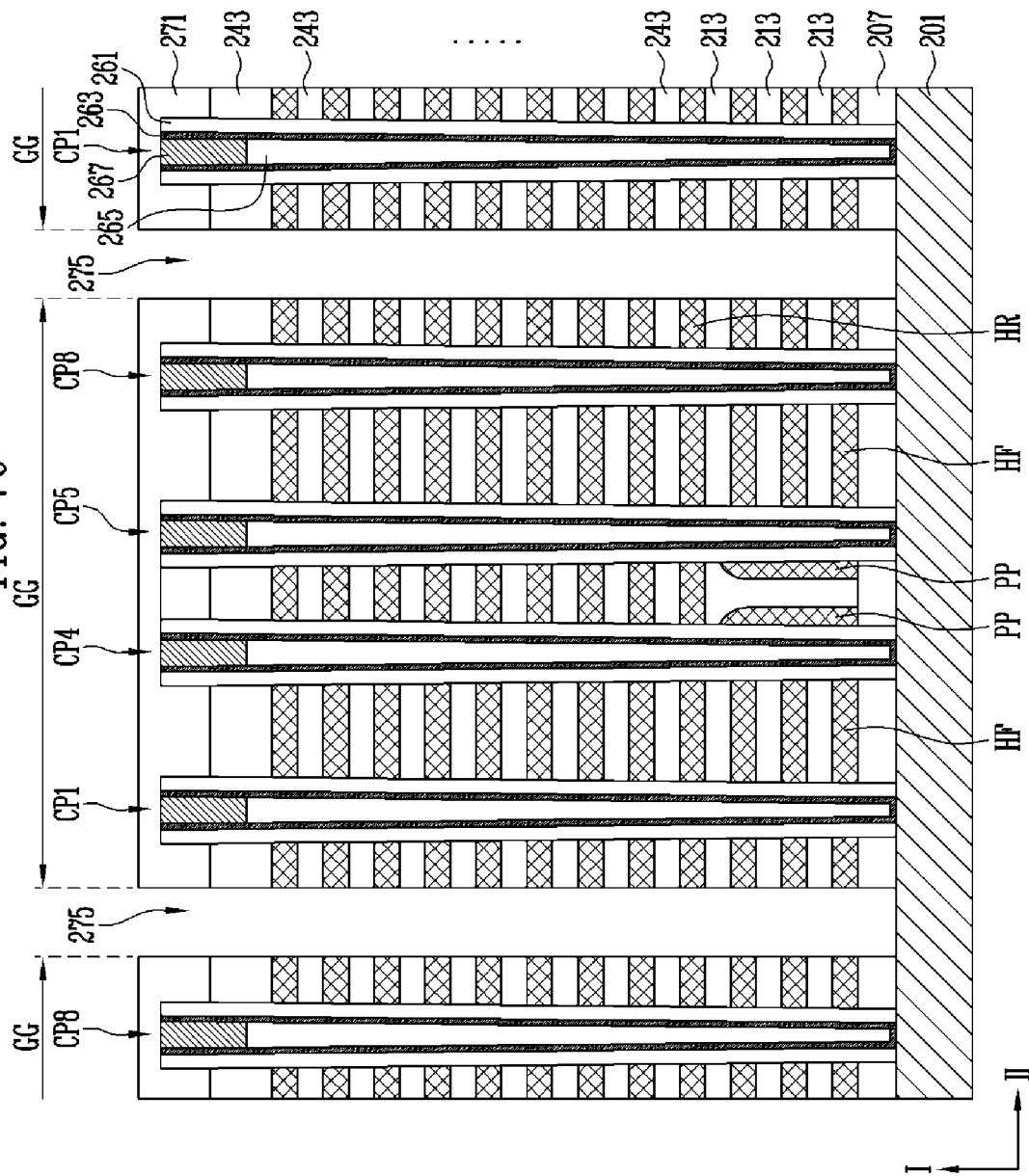

FIGS. 7A to 7C are sectional views illustrating a manufacturing method of a semiconductor device according to an embodiment of the present disclosure. FIGS. 7A to 7C illustrate an example of a manufacturing method of the semiconductor device illustrated in FIG. 3B.

Referring to FIG. 7A, a source layer 201 is provided. Although not illustrated in the drawing, the source layer 201 may be formed on a substrate having a driving circuit formed thereon. The source layer 201 may be a doped silicon layer including a first conductivity type impurity. The first conductivity type impurity may be an n-type impurity. The source layer 201 may form the source region SA illustrated in FIG. 3B.

Subsequently, a source insulating layer 207 may be formed on the source layer 201. After the source insulating layer 207 is formed, a first stack structure ST1 may be formed. The first stack structure ST1 is defined as a stack structure for half conductive patterns. The first stack structure ST1 may be formed by alternately stacking at least one pair of first and second material layers 211 and 213 as described in FIG. 6A.

After that, a first slit 229, vertical patterns 221P, and a slit insulating layer 231 are formed by using the processes described in FIGS. 6B and 6E. The first slit 229 isolates the first stack structure ST1 into a first sub-stack structure SUB1 and a second sub-stack structure SUB2 by penetrating the first stack structure ST1. The vertical patterns 221P are disposed on sidewalls of the first and second sub-stack structures SUB1 and SUB2, respectively. The slit insulating layer 231 fills in the first slit 229, and is disposed between the vertical patterns 221P.

Referring to FIG. 7B, after the first slit 229 and the slit insulating layer 231 are formed, a second stack structure ST2 is formed by alternately stacking third material layers 241 and fourth material layers 243. The second stack structure ST2 extend to overlap with the slit insulating layer 231, the first sub-stack structure SUB1, and the second sub-stack structure SUB2 on the first sub-stack structure SUB1, and the second sub-stack structure SUB2. Properties of the third material layers 241 and the fourth material layers 243 are the same as described in FIG. 6A.

After that, a mask layer 251 is formed on the second stack structure ST2, and regions in which holes H1 to H8 of first to 2Kth columns are to be arranged are defined by patterning the mask layer 251, using a photolithography process.

Subsequently, the holes H1 to H8 of the first to 2Kth columns are formed by using the processes described in FIG. 6F. An arrangement of the holes H1 to H8 of the first to 2Kth columns is the same as described in FIG. 6F.

After that, cell plugs CP1 to CP8 of the first to 2Kth columns are formed in the holes H1 to H8 of the first to 2Kth columns. An arrangement of the cell plugs CP1 to CP8 of the first to 2Kth columns is the same as described in FIG. 6G.

Each of the cell plugs CP1 to CP8 of the first to 2Kth columns may include a multi-layered memory pattern 261, a channel pillar 263, a core insulating layer 265, and a capping conductive pattern 267. The multi-layered memory pattern 261 may include a blocking insulating layer, a data storage layer, and a tunnel insulating layer as described in FIGS. 2A to 3B and FIGS. 5A and 5B.

The multi-layered memory pattern 261 is formed on a sidewall of each of the holes H1 to H8 of the first to 2Kth columns. The source layer 201 is exposed through a central region of each of the holes H1 to H8 of the first to 2Kth columns, which is defined by the multi-layered memory pattern 261. The channel pillar 263 is formed on the multi-layered memory pattern 261 to be in contact with the source layer 201. The channel pillar 263 has a sidewall surrounded by the multi-layered memory pattern 261. The core insulating layer 265 and the capping conductive pattern 267 are formed in the same structure as described in FIG. 6G. Properties of the multi-layered memory pattern 261, the channel pillar 263, the core insulating layer 265, and the capping conductive pattern 267 are the same as described in FIG. 6G.

Referring to FIG. 7C, after the mask layer 251 described in FIG. 7B is removed, an upper insulating layer 271 covering the cell plugs CP1 to CP8 is formed. After that, second slits 275 are formed between cell plugs CP1 of first columns and cell plugs CP8 of Kth columns, which are adjacent to each other. The second slits 275 extend to expose the source layer 201 therethrough.

A subsequent process may be variously performed as described in FIGS. 6I and 6J. Gate groups GG including half conductive patterns HF, horizontal conductive patterns HR, and vertical conductive patterns PP are formed by using various processes described in FIGS. 6I and 6J. The gate groups GG are isolated from each other by the second slits 275.

The semiconductor devices illustrated in FIGS. 2B and 3A may be formed by modifying the processes described in FIGS. 6A to 6K and 7A to 7C.

Schematically, the method of manufacturing the semiconductor device illustrated in FIG. 2B may include a step of forming the first stack structure ST1 illustrated in FIG. 6A after the second stack structure ST2 illustrated in FIG. 6A is formed on the source layer 201 and the source insulating layer 207, which are illustrated in FIG. 7A. In order to manufacture the semiconductor device illustrated in FIG. 2B, the first stack structure ST1 may be isolated into the first sub-stack structure SUB1 and the second sub-stack structure SUB2 through a first slit by using the processes described in FIGS. 6A to 6E. The first slit may have both sidewalls covered by vertical patterns, and be filled with a slit insulating layer. Subsequently, in order to manufacture the semiconductor device illustrated in FIG. 2B, cell plugs having the structure described in FIG. 7B may be formed. After that, horizontal conductive patterns, half conductive patterns, and vertical conductive patterns may be formed by using the processes described in FIGS. 6H to 6J.

The method of manufacturing the semiconductor device illustrated in FIG. 3A may include a step of forming the first sub-stack structure SUB1 and the second sub-stack structure SUB2, which are illustrated in FIG. 7A, on the first source layer 101, the protective layer 103, the sacrificial source layer 105, and the source insulating layer 107, which are illustrated in FIG. 6A. The first sub-stack structure SUB1 and the second sub-stack structure SUB2 may be isolated by a first slit. The first slit may have both sidewalls covered with vertical patterns, and be filled with a slit insulating layer. Subsequently, the second stack structure ST2 illustrated in FIG. 7B is disposed on the first sub-stack structure SUB1 and the second sub-stack structure SUB2. After that, in order to manufacture the semiconductor device illustrated in FIG. 3A, the processes described in FIGS. 6F to 6K may be performed.

FIGS. 8A to 8C are sectional views illustrating a manufacturing method of a semiconductor device according to an embodiment of the present disclosure. FIGS. 8A to 8C illustrates an example of a process of forming half conductive patterns and vertical conductive patterns, which may be used to form the structures illustrated in FIGS. 2A to 3B.

Referring to FIG. 8A, a first stack structure ST1 is formed on a lower layer 300. The lower layer 300 may include layers disposed under the first stack structure ST1 described in FIG. 6A, or include layers disposed under the first stack structure ST1 described in FIG. 7A.

The first stack structure ST1 may be formed by alternately stacking first material layers 311 and second material layers 313. In a first case, the second material layer 313 may be formed of a first insulating material, and the first material layer 311 may be formed of a second insulating material for sacrificial layers, which has an etching rate different from that of the second material layer 313. Properties of the first insulating material and the second insulating material are the same as described in FIG. 6A.

Subsequently, the first stack structure ST1 may be isolated into a first sub-stack structure SUB1 and a second sub-stack structure SUB2 by using the processes described in FIGS.

6B to 6E. The first sub-stack structure SUB1 and the second sub-stack structure SUB2 may be isolated from each other by a slit insulating layer 323 that penetrates the first stack structure ST1. Vertical conductive patterns PP are disposed on both sidewalls of the slit insulating layer 323, which face the first sub-stack structure SUB1 and the second sub-stack structure SUB2.

The vertical conductive patterns PP may be formed of a first conductive material. The second material layer 313 may be formed of a material having an etching rate different from that of the first conductive material. The vertical conductive patterns PP may be in contact with upper surfaces of the first material layers 111 disposed as the lowermost layers of the first sub-stack structure SUB1 and the second sub-stack structure SUB2. The vertical conductive patterns PP may be covered by the slit insulating layer 323.

Referring to FIG. 8B, cell plugs CP1 to CP8 of first to 2Kth columns are formed. An arrangement of the cell plugs CP1 to CP8 of the first to 2Kth columns is the same as described in FIG. 6G.

Subsequently, second slits 375 are formed between cell plugs CP1 of first columns and cell plugs CP8 of Kth columns, which are disposed adjacent to each other. After that, first and second openings OP1 and OP2 are defined by removing second material layers exposed through the second slits 375. The first openings OP1 are connected to the second slits 375 to extend toward sidewalls of the vertical patterns PP. The second openings OP2 are connected to the second slits 375 to extend toward bottom surfaces of the vertical patterns PP.

Referring to FIG. 8C, each of the first and second openings OP1 and OP2 illustrated in FIG. 8B may be filled with a second conductive material 377. The second conductive material 377 is formed through a process different from that of forming the first conductive material constituting the vertical conductive patterns PP. Therefore, the second conductive material 377 may be formed of a conductive material different from the first conductive material.

The second material 377 disposed in each of the first openings OP1 is defined as an upper half conductive pattern HF_U, and the second conductive material 377 disposed in each of the second openings OP2 is defined as a lower half conductive pattern HF_L. The upper half conductive pattern HF_U extends toward the sidewall of the vertical conductive pattern PP. The lower half conductive pattern HF_L is connected to the bottom surface of the vertical conductive pattern PP. The lower half conductive pattern HF_L extends longer toward a second direction II than the upper half conductive pattern HF_U.

As described above, the first material layer may be replaced with the second conductive material through the second slits 375, except the second material layer and the vertical conductive pattern PP.

Figure 9:
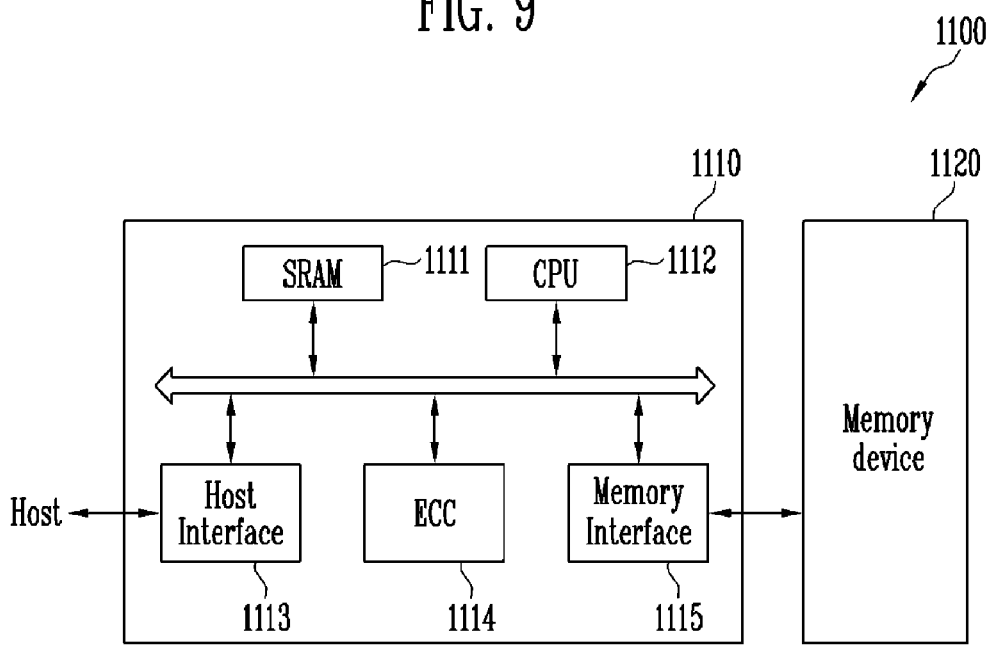
FIG. 9 is a block diagram illustrating a configuration of a memory system according to an embodiment of the present disclosure.

FIG. 9 is a block diagram illustrating a configuration of a memory system according to an embodiment of the present disclosure.

Referring to FIG. 9, the memory system 1100 according to the embodiment of the present disclosure includes a memory device 1120 and a memory controller 1110.

The memory device 1120 may include at least one of the structures described in FIGS. 2A to 3B and constituting at least one of the circuits described in FIGS. 1A and 1B. For example, the memory device 1120 may include at least one half conductive pattern extending from a vertical conductive pattern. The memory device 1120 may be a multi-chip package configured with a plurality of flash memory chips.

The memory controller 1110 is configured to control the memory device 1120, and may include a static random access memory (SRAM) 1111, a CPU 1112, a host interface 1113, an error correction code (ECC) 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a solid state disk (SSD), in which the memory device 1120 is combined with the controller 1110. For example, when the memory system 1100 is an SSD, the memory controller 1100 may communicated with the outside (e.g., the host) through one among various interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, and an integrated drive electronics (IDE) protocol.

Figure 10:
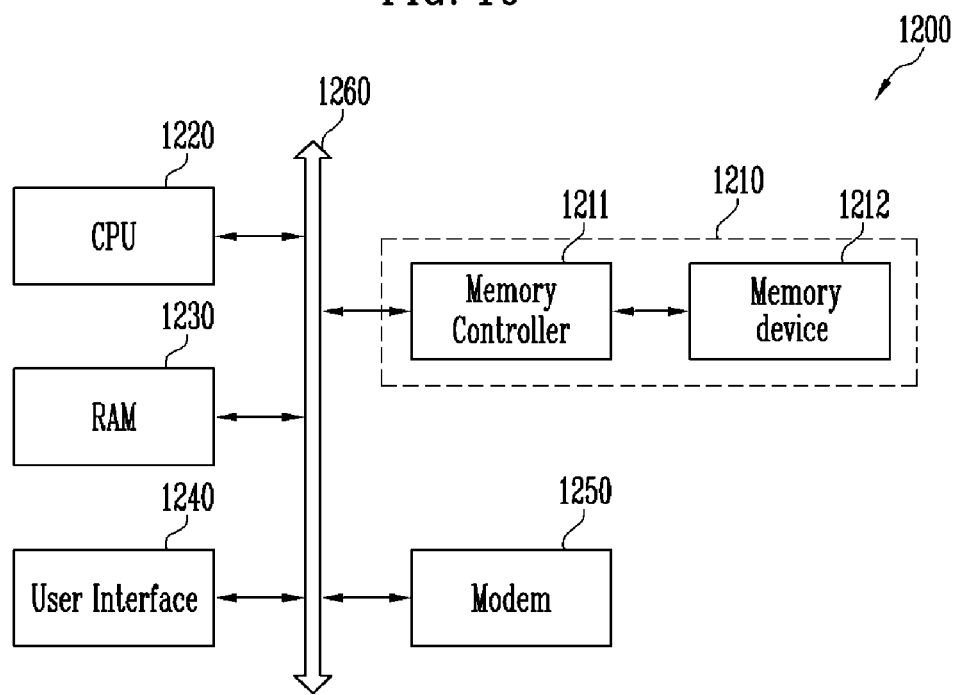
FIG. 10 is a block diagram illustrating a configuration of a computing system according to an embodiment of the present disclosure.

FIG. 10 is a block diagram illustrating a configuration of a computing system according to an embodiment of the present disclosure.

Referring to FIG. 10, the computing system 1200 according to an embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a camera image processor (CIS), a mobile D-RAM, and the like may be further included.

The memory system 1210, as described with reference to FIG. 9, may be configured with a memory device 1212 and a memory controller 1211.

According to the present disclosure, electrical characteristics of a select transistor disposed adjacent to a first slit may be improved through vertical conductive patterns formed on a sidewall of the first slit, so that the operational reliability of the semiconductor device can be improved.

Examples of the embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
a word line;
a first select structure including a first horizontal conductive pattern overlapping the word line in a first direction, wherein the first horizontal conductive pattern and the word line include a first hole and a second hole;
a second select structure including a second horizontal conductive pattern overlapping the word line in the first direction and spaced apart from the first select structure in a second direction perpendicular to the first direction, wherein the second horizontal conductive pattern and the word line include a third hole and a fourth hole; and
channel pillars formed in the first hole, the second hole, the third hole and the fourth hole, respectively,
wherein the first hole has sidewalls that face opposite directions and are symmetric, and
wherein the first horizontal conductive pattern is absent between the first select structure and the second select structure.

2. The semiconductor device of claim 1,
wherein the second hole is closer to the second select structure than the first hole.

3. The semiconductor device of claim 1,
wherein the sidewalls of the first hole include a first sidewall toward the second select structure and surrounded by the first horizontal conductive pattern, and
wherein the first select structure further includes a first vertical pattern forming a second sidewall blocking one side of the second hole facing the second select structure.

4. The semiconductor device of claim 3,
wherein the first sidewall has a different shape from the second sidewall on a plane of the first select structure.

5. The semiconductor device of claim 3,
wherein the first sidewall is formed in a curved shape on a plane of the first select structure, and
wherein the second sidewall is formed in a straight shape on the plane of the first select structure.

6. The semiconductor device of claim 1,
wherein the second horizontal conductive pattern is absent between the first select structure and the second select structure, and
wherein the fourth hole has sidewalls that face opposite directions and are symmetric.

7. The semiconductor device of claim 6,
wherein the second hole and the third hole are disposed between the first hole and the fourth hole.

8. The semiconductor device of claim 6,
wherein the third hole is closer to the first select structure than the fourth hole.

9. The semiconductor device of claim 6,
wherein the sidewalls of the fourth hole include a first sidewall toward the first select structure and surrounded by the second horizontal conductive pattern, and
wherein the second select structure further includes a second vertical pattern forming a second sidewall blocking one side of the third hole facing the first select structure.

10. The semiconductor device of claim 9,
wherein the first sidewall has a different shape from the second sidewall on a plane of the second select structure.

11. The semiconductor device of claim 9,
wherein the first sidewall is formed in a curved shape on a plane of the second select structure, and
wherein the second sidewall is formed in a straight shape on the plane of the second select structure.

12. The semiconductor device of claim 1, further comprising:
a slit between the first select structure and the second select structure,
wherein the second hole is closer to the slit than the first hole, and
wherein the third hole is closer to the slit than the fourth hole.

13. The semiconductor device of claim 12,
wherein the first hole is symmetrical to the fourth hole based on the slit, and
wherein the second hole is symmetrical to the third hole based on the slit.

14. The semiconductor device of claim 12,
wherein the first horizontal conductive pattern extends to block one side of the first hole toward the slit,
wherein the second horizontal conductive pattern extends to block one side of the fourth hole toward the slit,
wherein the first select structure further includes a first vertical pattern forming a first sidewall blocking one side of the second hole toward the slit, and
wherein the second select structure further includes a second vertical pattern forming a second sidewall blocking one side of the third hole toward the slit.

15. The semiconductor device of claim 14,
wherein each of the one side of the first hole and the one side of the fourth hole is formed in a curved shape on a plane parallel to the word line, and
wherein each of the first sidewall and the second sidewall is formed in a straight shape on the plane parallel to the word line.

16. The semiconductor device of claim 12,
wherein the first select structure further includes a first vertical conductive pattern covering a first vertical sidewall of the slit,
wherein the first horizontal conductive pattern extends from the first vertical conductive pattern in a direction away from the slit,
wherein the second select structure further includes a second vertical conductive pattern covering a second vertical sidewall of the slit, and
wherein the second horizontal conductive pattern extends from the second vertical conductive pattern in a direction away from the slit.

17. The semiconductor device of claim 12, further comprising:
an insulating layer formed in the slit,
wherein the word line continuously extends to overlap with the first select structure, the second select structure, and the insulating layer.

* * * * *